US008711891B2

(12) United States Patent
Motomura et al.

(10) Patent No.: US 8,711,891 B2
(45) Date of Patent: Apr. 29, 2014

(54) SURFACE EMITTING LASER DEVICE, SURFACE EMITTING LASER ARRAY, OPTICAL SCANNING DEVICE, AND IMAGE FORMING APPARATUS

(75) Inventors: Hiroshi Motomura, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 210 days.

(21) Appl. No.: 12/917,080

(22) Filed: Nov. 1, 2010

(65) Prior Publication Data

US 2011/0116147 A1 May 19, 2011

(30) Foreign Application Priority Data

Nov. 18, 2009 (JP) ................................ 2009-262420
Jul. 27, 2010 (JP) ................................ 2010-167735

(51) Int. Cl.
*H01S 5/00* (2006.01)
*H01S 3/097* (2006.01)

(52) U.S. Cl.
USPC ...................... 372/44.011; 372/46.01; 372/87

(58) Field of Classification Search
USPC ........ 372/43.01, 44.011, 46.01, 50.124, 50.1, 372/87
See application file for complete search history.

(56) References Cited

U.S. PATENT DOCUMENTS

| 5,172,385 | A | * | 12/1992 | Forrest et al. ............. 372/50.21 |
| 5,923,691 | A | | 7/1999 | Sato |
| 5,939,733 | A | | 8/1999 | Sato |
| 5,940,422 | A | | 8/1999 | Johnson |
| 6,002,700 | A | | 12/1999 | Sato |
| 6,072,196 | A | | 6/2000 | Sato |
| 6,207,973 | B1 | | 3/2001 | Sato et al. |
| 6,233,264 | B1 | | 5/2001 | Sato |
| 6,529,541 | B1 | | 3/2003 | Ueki et al. |
| 6,542,528 | B1 | | 4/2003 | Sato et al. |
| 6,563,851 | B1 | | 5/2003 | Jikutani et al. |
| 6,614,821 | B1 | | 9/2003 | Jikutani et al. |
| 6,661,823 | B1 | | 12/2003 | Otoma et al. |
| 6,674,785 | B2 | | 1/2004 | Sato et al. |
| 6,765,232 | B2 | | 7/2004 | Takahashi et al. |
| 6,803,604 | B2 | | 10/2004 | Takahashi et al. |

(Continued)

FOREIGN PATENT DOCUMENTS

CA 2347708 3/2001
EP 2323231 A1 5/2011

(Continued)

OTHER PUBLICATIONS

Nov. 10, 2011 European search report in connection with counterpart European patent application No. 10 19 0741.

(Continued)

*Primary Examiner* — Armando Rodriguez
(74) *Attorney, Agent, or Firm* — Cooper & Dunham LLP

(57) ABSTRACT

A disclosed surface emitting laser device includes an oscillator structure including an active layer, semiconductor multilayer reflection mirrors sandwiching the oscillator structure, an electrode provided on an emitting surface where light is emitted in a manner such that the electrode surrounds an emitting region, and a dielectric film formed in at least one region outside a center part of the emitting region so that a refractive index of the region outside the center part of the emitting region is less than the refractive index of the center part of the emitting region. When viewed from an emitting direction of the light, a part of the electrode overlaps a part of the dielectric film.

20 Claims, 27 Drawing Sheets

(56) References Cited

U.S. PATENT DOCUMENTS

| | | |
|---|---|---|
| 6,927,412 B2 | 8/2005 | Takahashi et al. |
| 6,959,025 B2 | 10/2005 | Jikutani et al. |
| 6,975,663 B2 | 12/2005 | Sekiya et al. |
| 7,684,458 B2 | 3/2010 | Sato et al. |
| 7,693,204 B2 | 4/2010 | Sato et al. |
| 7,720,125 B2 | 5/2010 | Jikutani et al. |
| 7,746,912 B2 | 6/2010 | Motomura et al. |
| 7,800,805 B2 | 9/2010 | Hayashi et al. |
| 2004/0028103 A1* | 2/2004 | Ueki ................................ 372/46 |
| 2006/0269666 A1 | 11/2006 | Nagawa et al. |
| 2007/0014324 A1* | 1/2007 | Maeda et al. ............. 372/46.01 |
| 2008/0055672 A1 | 3/2008 | Watanabe et al. |
| 2008/0233017 A1 | 9/2008 | Sato et al. |
| 2009/0180506 A1 | 7/2009 | Maeda et al. |
| 2009/0262770 A1 | 10/2009 | Itoh et al. |
| 2009/0285252 A1 | 11/2009 | Ishii et al. |
| 2009/0285602 A1 | 11/2009 | Harasaka et al. |
| 2009/0295902 A1 | 12/2009 | Sato et al. |
| 2009/0303308 A1 | 12/2009 | Itoh et al. |
| 2009/0310632 A1 | 12/2009 | Sugawara et al. |
| 2010/0060712 A1 | 3/2010 | Sato et al. |
| 2010/0214633 A1 | 8/2010 | Sato et al. |
| 2011/0112872 A1* | 5/2011 | Rabson et al. ..................... 705/4 |
| 2011/0115872 A1* | 5/2011 | Harasaka et al. ............. 347/224 |
| 2011/0123227 A1 | 5/2011 | Hanaoka |
| 2011/0128343 A1 | 6/2011 | Sato et al. |
| 2011/0194579 A1 | 8/2011 | Maeda et al. |

FOREIGN PATENT DOCUMENTS

| | | |
|---|---|---|
| EP | 2328244 A1 | 6/2011 |
| EP | 2330698 A1 | 6/2011 |
| JP | 2001-156395 | 6/2001 |
| JP | 2002-9393 | 1/2002 |
| JP | 2002-208755 | 7/2002 |
| JP | 2007-299896 | 11/2007 |
| JP | 2008-16824 | 1/2008 |
| JP | 2008-28424 | 2/2008 |
| WO | WO2005/082010 A2 | 9/2005 |
| WO | WO2010/061947 A1 | 6/2010 |
| WO | WO2011/034194 A1 | 3/2011 |

OTHER PUBLICATIONS

Jan. 2, 2013 European official action in connection with counterpart European patent Application No. 10 19 0741.8.

Japanese official action dated Jan. 7, 2014 in corresponding Japanese patent application No. 2010-167735.

* cited by examiner

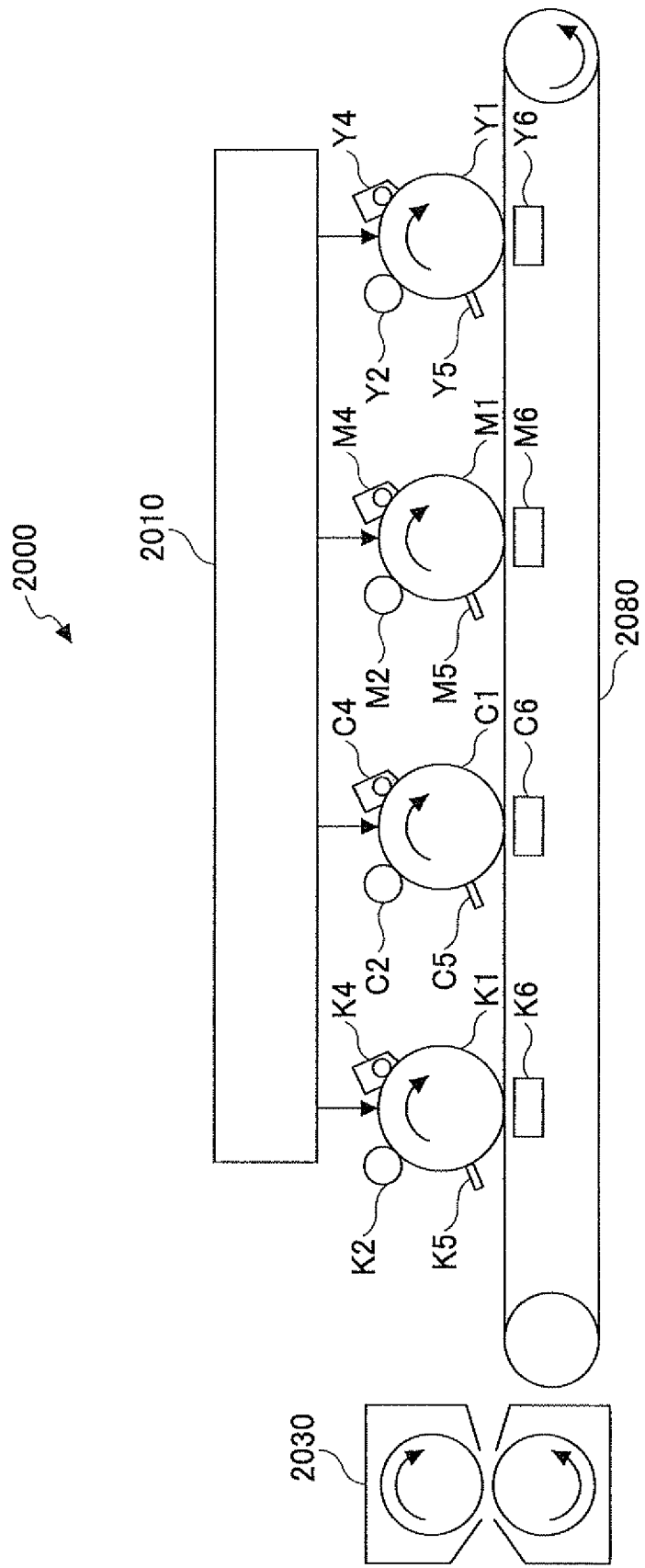

SURFACE EMITTING LASER DEVICE, SURFACE EMITTING LASER ARRAY, OPTICAL SCANNING DEVICE, AND IMAGE FORMING APPARATUS

CROSS-REFERENCE TO RELATED APPLICATIONS

The present application claims priority under 35 U.S.C §119 based on Japanese Patent Application Nos. 2009-262420 filed Nov. 18, 2009 and 2010-167735 filed Jul. 27, 2010, the entire contents of which are hereby incorporated herein by reference.

BACKGROUND OF THE INVENTION

1. Field of the Invention

The present invention relates to a surface emitting laser device, a surface emitting laser array, an optical scanning device, and an image forming apparatus. More particularly, the present invention relates to a surface emitting laser device and a surface emitting laser array capable of emitting light in the direction orthogonal to their substrate, an optical scanning device including the surface emitting laser device or the surface emitting laser array, and an image forming apparatus having the optical scanning device.

2. Description of the Related Art

A Vertical Cavity Surface Emitting Laser (hereinafter may be referred to as "VCSEL") is capable of emitting light in the direction orthogonal to its substrate. When compared with edge emitting semiconductor lasers capable of emitting light in the direction parallel to its substrate, the VCSEL may have some advantages such as lower cost, lower energy consumption, smaller size, preferable to two-dimensionally integrated devices, and higher performance. Recently, because of those advantages, the VCSEL has attracted increased attention.

The application fields of the surface emitting laser device include a light source (oscillation wavelength: 780 nm band) for an optical writing system in a printer, a writing light source (oscillation wavelength: 780 nm band and 850 nm band) in an optical disk apparatus, and a light source (oscillation wavelength: 780 nm band, 850 nm band, 1.3 µm band, and 1.5 µm band) in a light transmission system such as an LAN (Local Area Network) using optical fibers. Further, a surface emitting laser device is expected to be used as a light source for optical transmissions between boards, within a board, between chips in a Large Scale Integrated Circuit (LSI), and within a chip in the LSI.

In those application fields, it is generally desired that the light emitted from the surface emitting laser device (hereinafter referred to as "emitting light") has a high-power single lateral mode. Especially, there is a strong demand for high power in the fundamental lateral mode oscillation. To that end, it is required to suppress the high-order lateral mode oscillation, and various efforts have been made.

For example, Japanese Patent Application Publication No. 2001-156395 (Patent Document 1) and U.S. Pat. No. 5,940,422 (Patent Document 2) propose a configuration having an upper electrode and a mode-selection filter, the upper electrode being provided on an emission surface through which the laser light is emitted and being provided so as to surround the emitting region, the mode-selection filter being made of a transparent dielectric film designed so that the reflectance of the center part is different from that of the surrounding part. Specifically, in some cases, the reflectance of the center part is set greater than that of the surrounding part in the emitting region, so as to facilitate the fundamental lateral mode operation to increase the power of fundamental mode output. In other cases, the reflectance of the surrounding part is set greater than that of the center part in the emitting region, so as to facilitate the high-order lateral mode operation.

However, in the configurations disclosed in Patent Documents 1 and 2, when the adhesion between the filter and the contact layer is not sufficient, the filter may be peeled off. Further, due to the gap between the filter and the upper electrode, the emission surface and the contact layer may be contaminated or oxidized.

SUMMARY OF THE INVENTION

The present invention is made in light of the above problems and may provide a surface emitting laser device having excellent long-term reliability while suppressing the high-order lateral mode oscillation.

Further, the present invention may provide a surface emitting laser array having excellent long-term reliability while suppressing the high-order lateral mode oscillation.

Further, the present invention may provide an optical scanning device capable of performing stable optical scanning.

Further, the present invention may provide an image forming apparatus capable of forming a high-quality image.

According to an aspect of the present invention, a surface emitting laser device (100) includes an oscillator structure (104, 105, 106) including an active layer (105), semiconductor multilayer reflection mirrors (103, 107) sandwiching the oscillator structure (104, 105, 106), an electrode (113) provided on an emitting surface where a light is emitted, the electrode (113) being provided in a manner such that the electrode (113) surrounds an emitting region, and a dielectric film (115) formed in at least one region outside a center part of the emitting region so that a refractive index of the region outside the center part of the emitting region is less than the refractive index of the center part of the emitting region. Further, when viewed from an emitting direction of the light, a part of the electrode (113) overlaps a part of the dielectric film (115).

By having this structure, it may become possible to improve long-term reliability while suppressing high-order lateral mode oscillation.

BRIEF DESCRIPTION OF THE DRAWINGS

Other objects, features, and advantages of the present invention will become more apparent from the following description when read in conjunction with the accompanying drawings, in which:

FIG. 22 is a drawing illustrating a schematic configuration of a color printer.

DETAILED DESCRIPTION OF THE PREFERRED EMBODIMENTS

Figure 1:
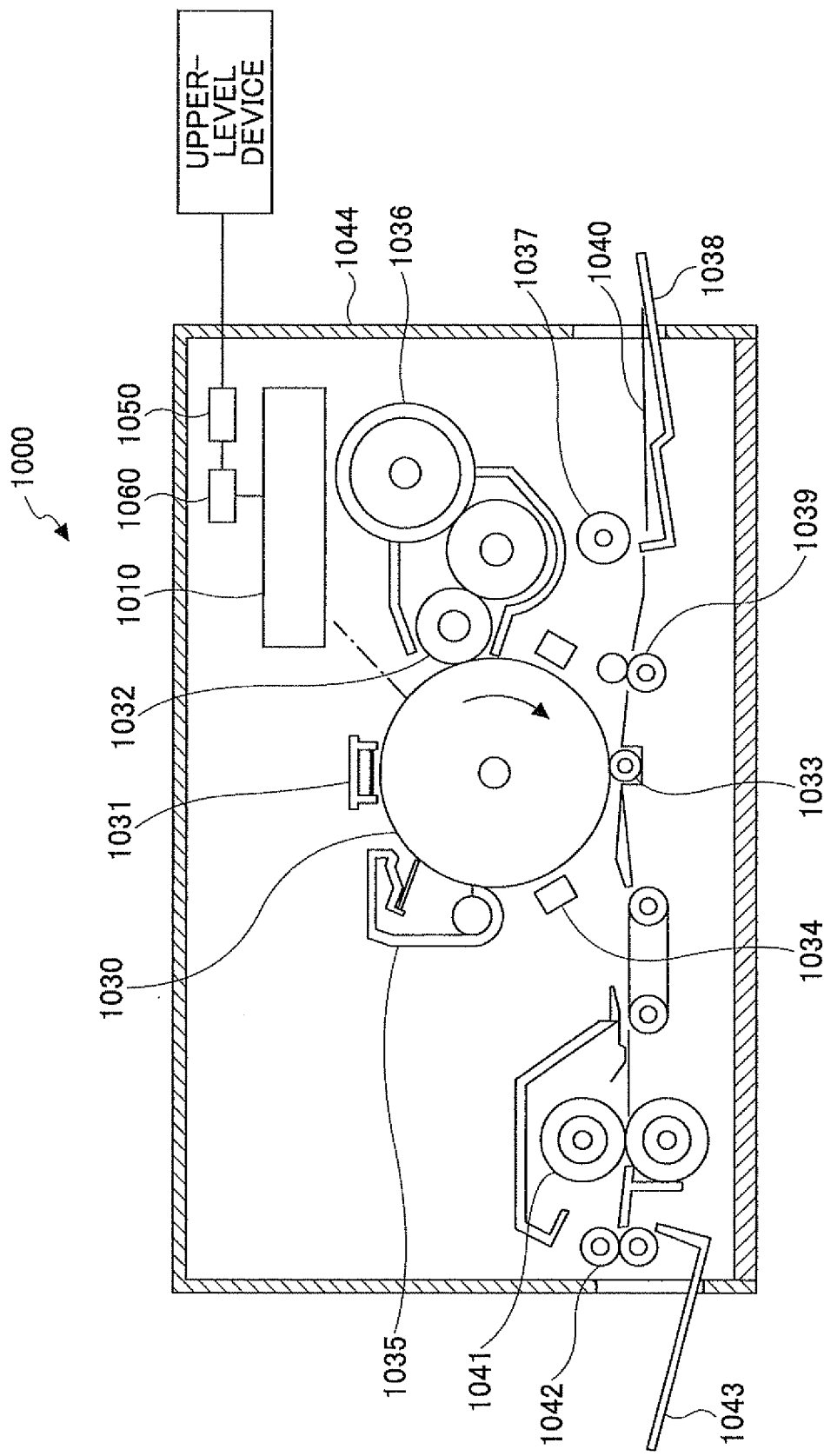
FIG. 1 is a schematic view illustrating a configuration of a laser printer according to an embodiment of the present invention.

In the following, an embodiment of the present invention is described with reference to FIGS. 1 through 11. FIG. 1 schematically shows a configuration of a laser printer 1000 according to an embodiment of the present invention.

As shown in FIG. 1, the laser printer 1000 includes an optical scanning device 1010, a photosensitive drum 1030, a charger 1031, a developing roller 1032, a transfer charger 1033, a neutralizing unit 1034, a cleaning unit 1035, a toner cartridge 1036, a sheet feeding roller 1037, a sheet feeding tray 1038, a resist roller pair 1039, a fixing roller 1041, a discharging roller 1042, a discharging tray 1043, a communication control device 1050, and a printer controlling device 1060 generally controlling the above elements. These elements are disposed at their respective positions in a printer chassis 1044.

The communication control device 1050 controls two-way communications with an upper-level device (such as a personal computer) through a network.

The photosensitive drum 1030 has a cylindrical shape, and a photosensitive layer is formed on the surface of the photosensitive drum 1030. Namely, the surface of the photosensitive drum 1030 is a surface to be scanned. The photosensitive drum 1030 rotates in the direction indicated by the arrow (indicated in the photosensitive drum 1030) in FIG. 1.

The charger 1031, the developing roller 1032, the transfer charger 1033, the neutralizing unit 1034, and the cleaning unit 1035 are disposed in the vicinity of the surface of the photosensitive drum 1030. Further, the charger 1031, the developing roller 1032, the transfer charger 1033, the neutralizing unit 1034, and the cleaning unit 1035 are sequentially arranged in this order along the rotating direction of the photosensitive drum 1030.

The charger 1031 uniformly charges the surface of the photosensitive drum 1030.

The optical scanning device 1010 scans a light flux modulated based on image information from the upper-level device. By doing this, a latent image based on the image information is formed on the surface of the photosensitive drum 1030, the surface being charged by the charger 1031. The formed latent image is moved to the direction of the developing roller 1032 by the rotation of the photosensitive drum 1030. The configuration of the optical scanning device 1010 is described below.

The toner cartridge 1036 contains toner, and the toner is supplied to the developing roller 1032.

The developing roller 1032 causes the toner supplied from the toner cartridge 1036 to adhere onto the latent image formed on the surface of the photosensitive drum 1030 to visualize the image information. The latent image with toner adhered (hereinafter may be referred to as a "toner image" for convenience) is moved to the direction of the transfer charger 1033 by the rotation of the photosensitive drum 1030.

The sheet feeding tray 1038 stores recording sheets 1040. In the vicinity of the sheet feeding tray 1038, the sheet feeding roller 1037 is provided. The sheet feeding roller 1037 feeds the recording sheets 1040 from the sheet feeding tray 1038 to the resist roller pair 1039 one by one. The resist roller pair 1039 first holds the recording sheet 1040 taken out by the sheet feeding roller 1037, and sends out the recording sheet 1040 towards the gap between the photosensitive drum 1030 and the transfer charger 1033 in synchronization with the rotation of the photosensitive drum 1030.

A voltage having the polarity opposite to the polarity of the voltage of the toner is applied to the transfer charger 1033 to electrically attract the toner on the surface of the photosensitive drum 1030 to the recording sheet 1040. By applying the voltage, the toner image on the surface of the photosensitive drum 1030 is transferred onto the recording sheet 1040. The recording sheet 1040 with the transferred toner image is fed to the fixing roller 1041.

The fixing roller 1041 applies heat and pressure to the recording sheet 1040 to fix the toner onto the recording sheet 1040. The fixed recording sheet 1040 is discharged to the discharging tray 1043 to be sequentially stacked on the discharging tray 1043.

The neutralizing unit 1034 neutralizes the surface of the photosensitive drum 1030.

The cleaning unit 1035 removes the toner remaining on the surface of the photosensitive drum 1030 (residual toner). The surface of the photosensitive drum 1030 on which the residual toner is removed is returned to the position facing the charger 1031 again.

Next, a configuration of the optical scanning device 1010 is described.

Figure 2:
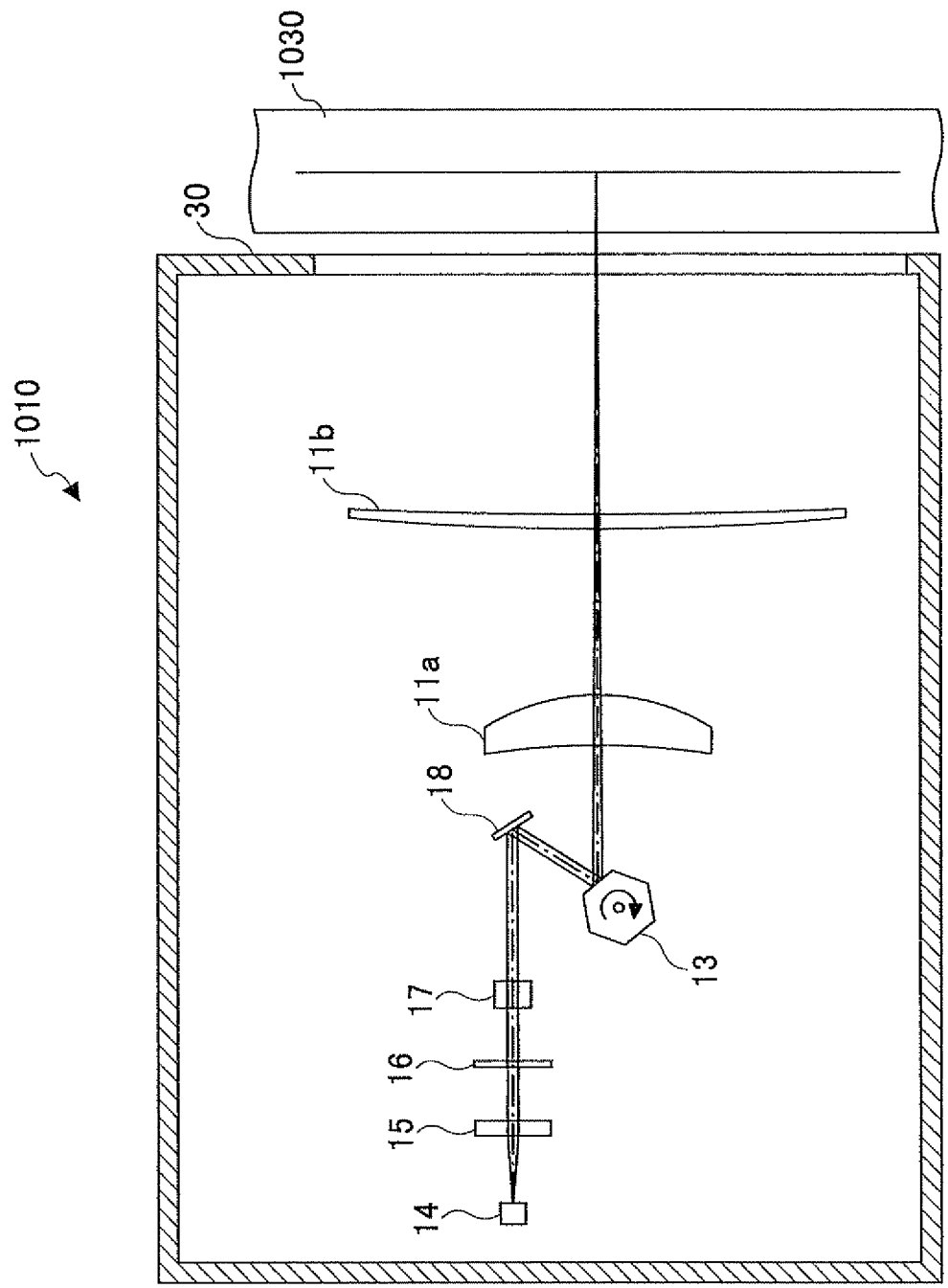
FIG. 2 is a schematic view illustrating an optical scanning device in FIG. 1.

For example, as shown in FIG. 2, the optical scanning device 1010 includes a deflector-side scanning lens 11a, an image-surface-side scanning lens 11b, a polygon mirror 13, a light source 14, a coupling lens 15, an aperture plate 16, a cylindrical lens 17, a reflection mirror 18, a scanning control device (not shown) and the like. These elements are disposed at their respective positions in an optical housing 30.

In the following, for convenience, the direction corresponding to a main scanning direction is simplified as a "main-scanning corresponding direction", and the direction corresponding to a sub-scanning direction is simplified as a "sub-scanning corresponding direction".

The coupling lens 15 converts the light flux output from the light source 14 into a substantially parallel light beam.

The aperture plate 16 has an opening to determine the diameter of the beam of the light flux having passed through the coupling lens 15.

The cylindrical lens 17 forms an image by refracting the light flux having passed through the opening of the aperture plate 16 in the vicinity of the deflection reflection surface of the polygon mirror 13 with respect to the sub-scanning corresponding direction via the reflection mirror 18.

The optical system disposed on the optical path between the light source 14 and the polygon mirror 13 may also be called a pre-deflector optical system. In this embodiment, the pre-deflector optical system includes the coupling lens 15, the aperture plate 16, the cylindrical lens 17, and the reflection mirror 18.

For example, the polygon mirror 13 has a hexagonal mirror surface having an inscribed with circle radius of 18 mm. Each of the mirrors serves as a deflection reflection surface. This polygon mirror 13 deflects the light flux from the reflection mirror 18 while rotating around an axis parallel to the sub-scanning corresponding direction.

The deflector-side scanning lens 11a is disposed on the optical path of the light flux deflected by the polygon mirror 13.

The image-surface-side scanning lens 11b is disposed on the optical path of the light flux having passed through the deflector-side scanning lens 11a. The light flux having passed through the image-surface-side scanning lens 11b is transmitted onto the surface of the photosensitive drum 1030 to form a light spot. The light spot moves in the longitudinal direction of the photosensitive drum 1030 in accordance with the rotation of the polygon mirror 13. Namely, the light spot is scanned on the surface of the photosensitive drum 1030. This moving direction of the light spot is the "main-scanning corresponding direction". Further, the rotation direction of the photosensitive drum 1030 is the "sub-scanning corresponding direction".

The optical system disposed on the optical path between the polygon mirror 13 and the photosensitive drum 1030 may also be called a scanning optical system. In this embodiment, the scanning optical system includes the deflector-side scanning lens 11a and the image-surface-side scanning lens 11b. Further, at least one folding mirror may be disposed on at least one of the optical paths between the deflector-side scanning lens 11a and the image-surface-side scanning lens 11b and between the image-surface-side scanning lens 11b and the photosensitive drum 1030.

Figure 3:
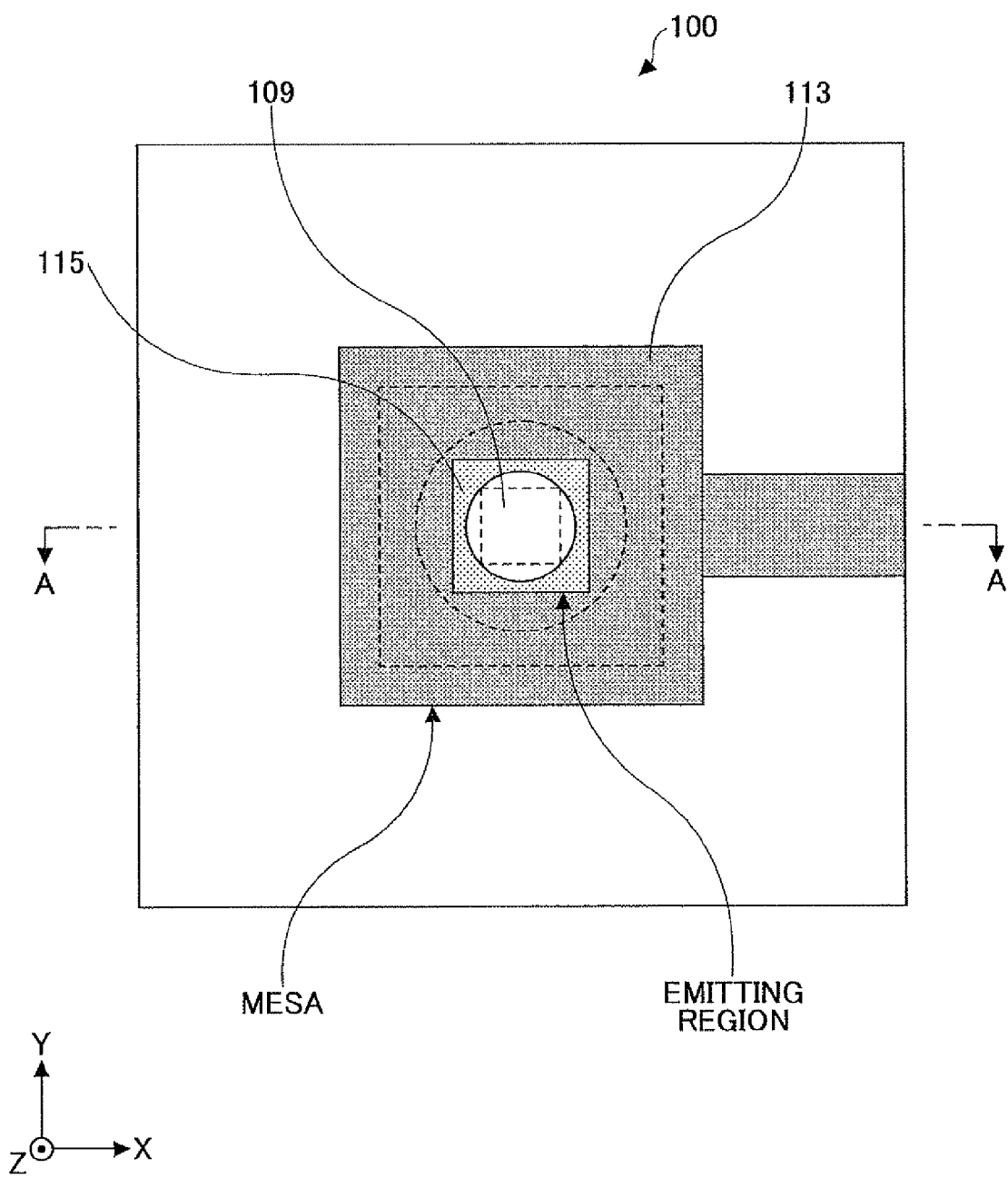
FIG. 3 is a drawing illustrating a surface emitting laser device included in a light source of FIG. 2.
Figure 4:
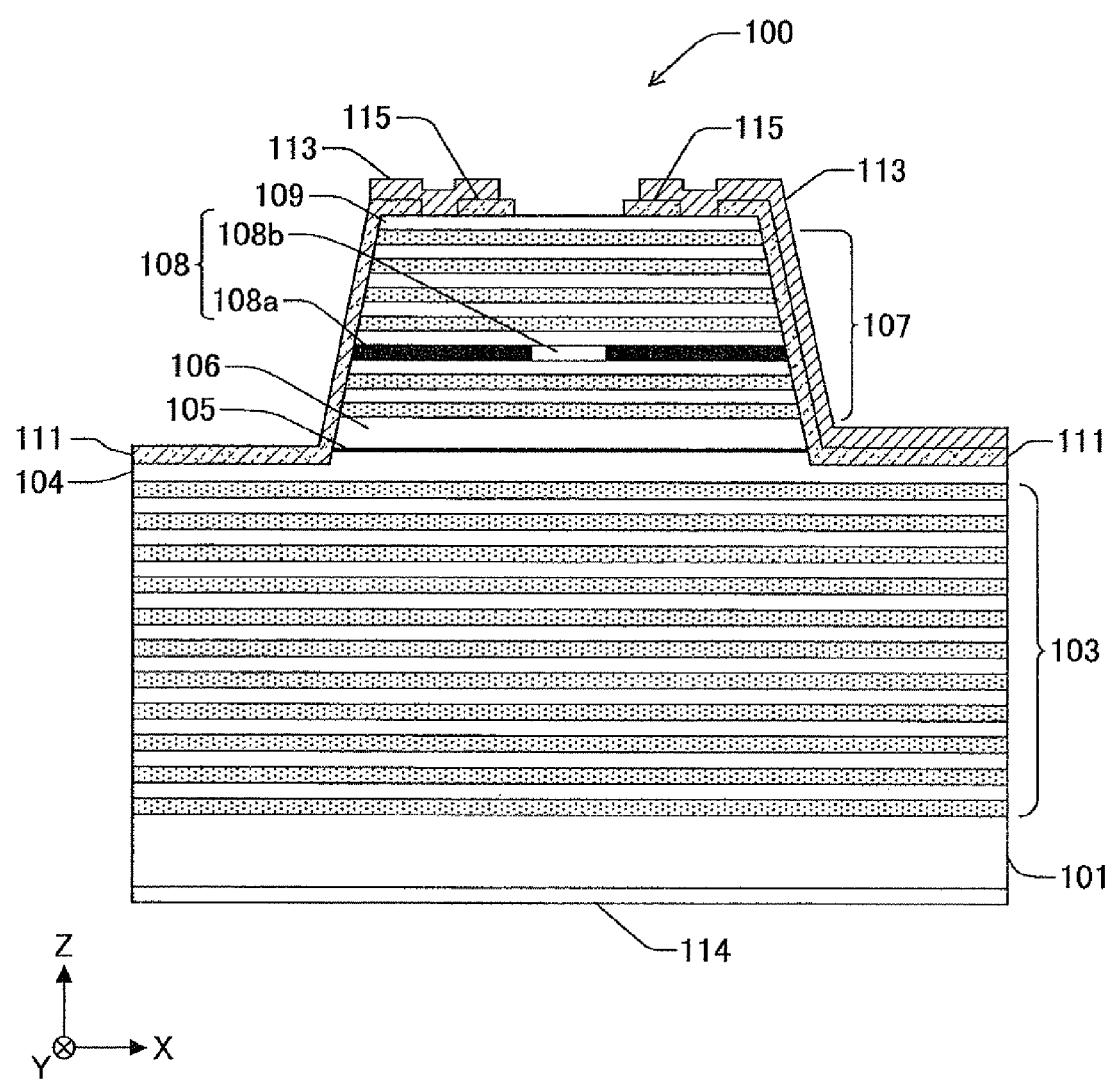
FIG. 4 is a cross-sectional view cut along the line A-A in FIG. 3.

For example, as shown in FIGS. 3 and 4, the light source 14 includes a surface emitting laser device 100. In this description, it is assumed that the Z axis direction in the figures is the direction parallel to the laser oscillation direction, and X axis direction and Y axis direction are orthogonal to each other in a plane orthogonal to the Z axis direction. Further, FIG. 3 is a drawing when viewed from the emitting direction of the light beam, and FIG. 4 is a cross-sectional view cut along the line A-A in FIG. 3.

The surface emitting laser device 100 is designed to oscillate at the wavelength band of 780 nm. As shown in FIG. 4, in the surface emitting laser device 100 includes a lower semiconductor DBR (Distribution Bragg Reflection) 103, a lower spacer layer 104, an active layer 105, an upper spacer layer 106, an upper semiconductor DBR 107, a contact layer 109, a p-side electrode 113, an n-side electrode 114, and a mode filter 115.

The substrate 101 is an n-GaAs single-crystal semiconductor substrate.

The lower semiconductor DBR 103 is laminated on a buffer layer (not shown) on the +Z side of the substrate 101, and includes 40.5 pairs of a low refractive index layer made of n-AlAs and a high refractive index layer made of n-$Al_{0.3}Ga_{0.7}As$. Further, a composition gradient layer having the thickness of 20 nm is interposed between adjacent ones of the refractive index layers to reduce the electrical resistance. In the composition gradient layer, the composition is gradually changed from one component to another component. Further, each of the refractive index layers is designed so that the optical thickness of the refractive index layer and one-half of each of the composition gradient layers adjoining the refractive index layer is equal to $\lambda/4$ ($\lambda$: oscillation wavelength). Further, there is a relationship between the optical thickness of a layer and an actual thickness of the layer, in which when the optical thickness of a layer is $\lambda/4$, the actual thickness "d" of the layer is expressed by the following formula:

$$d = \lambda/4n$$

where: the symbol "n" denotes a refractive index of the medium of the layer.

Further, the lower semiconductor DBR 103 serves as a semiconductor multilayer reflection mirror.

The lower spacer layer 104 is laminated on the +Z side of the lower semiconductor DBR 103, and is a layer made of $(Al_{0.1}Ga_{0.9})_{0.5}In_{0.5}P$.

The active layer 105 is laminated on the +Z side of the lower spacer layer 104, and has a triple quantum well structure having three quantum well layers and four barrier layers. Each quantum well layer is made of GaInAsP which is a component causing 0.7% of compression distortion, and has a band gap wavelength of approximately 780 nm. Further, each barrier layer is made of GaInP which is a component causing 0.6% of tension distortion.

The upper spacer layer 106 is laminated on the +Z side of the active layer 105 and is a layer made of non-doped $(Al_{0.1}Ga_{0.9})_{0.5}In_{0.5}P$.

The part including the lower spacer layer 104, the active layer 105, and the upper spacer layer 106 may also be called an "oscillator structure". The oscillation structure is designed so that its optical length is equal to one wavelength in optical thickness. Further, the active layer 105 is disposed at the position of the middle of the "oscillator structure" to obtain high stimulated emission probability, the position corresponding to an antinode position of the standing wave distribution of the electric field.

The upper semiconductor DBR 107 is laminated on the +Z side of the upper spacer layer 106, and includes 24 pairs of a low refractive index layer made of p-$Al_{0.9}Ga_{0.1}As$ and a high refractive index layer made of p-$Al_{0.3}Ga_{0.7}As$. Further, a composition gradient layer is interposed between adjacent ones of the refractive index layers to reduce the electrical resistance. In the composition gradient layer, the composition is gradually changed from one component to another component. Further, each of the refractive index layers is designed so that the optical thickness of the refractive index layer and one-half of each of the composition gradient layers adjoining the refractive index layer is equal to $\lambda/4$.

Further, the upper semiconductor DBR 107 serves as a semiconductor multilayer reflection mirror.

In one low refractive index layer included in the upper semiconductor DBR 107, a selectively-oxidized layer 108 made of p-AlAs and having a thickness of 30 nm is interposed. The interposed position of the selectively-oxidized layer 108 corresponds to the third node position of the standing wave distribution of the electric field from the active layer 105.

The contact layer 109 is laminated on the +Z side of the upper semiconductor DBR 107, and is made of p-GaAs.

The mode filter 115 is a dielectric film, laminated on the +Z side of the upper semiconductor DBR 107, and formed in an emitting region. Herein, for example, the mode filter 115 surrounds the center part of the emitting region, so that the reflectance of the part surrounding the center part (surrounding part) is lower than that of the center part.

Next, a method of manufacturing the surface emitting laser device 100 is briefly described with reference to FIGS. 5A through 11. In the following, for convenience, the structure in which the plural semiconductor layers are laminated on the substrate 101 may be called a "laminated body".

Figure 5A:
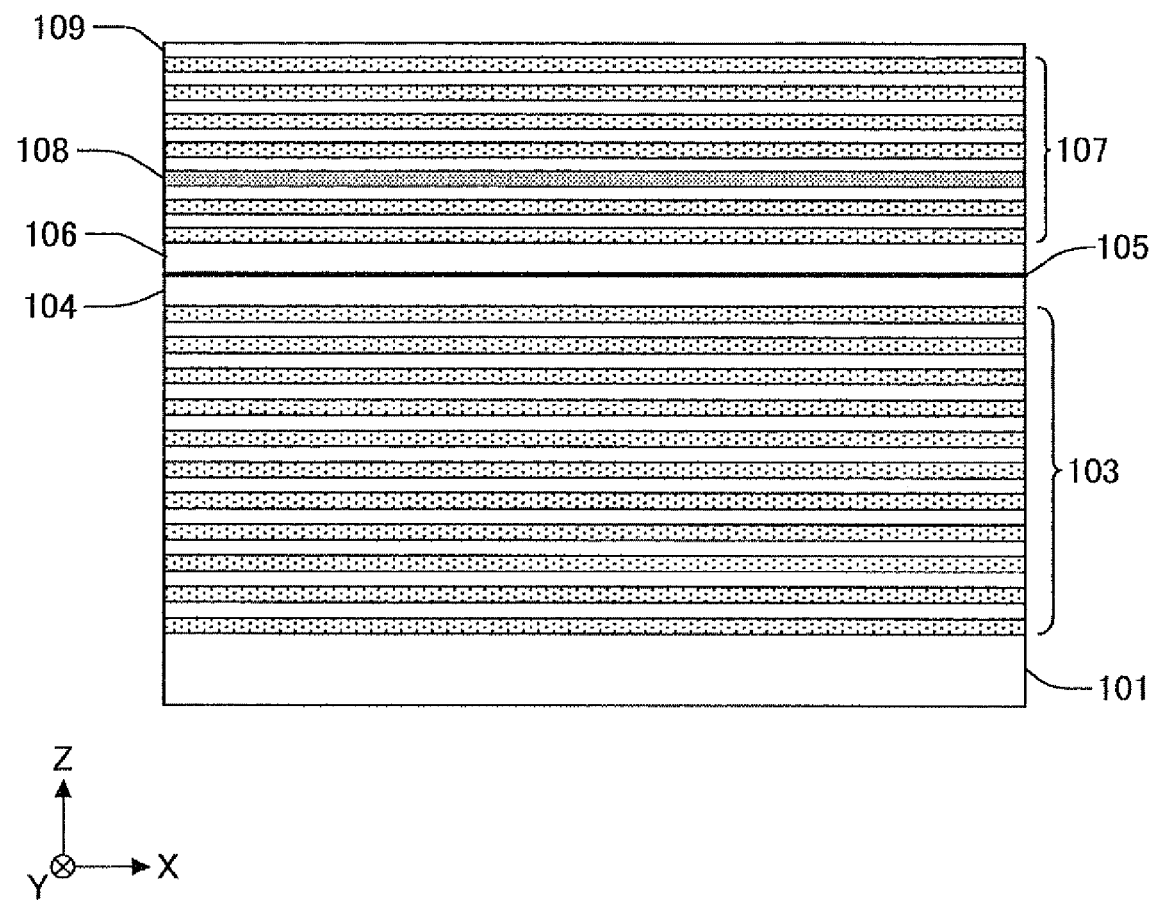
FIGS. 5A and 5B are drawings illustrating a method of manufacturing the surface emitting laser device in FIG. 3.
Figure 5B:
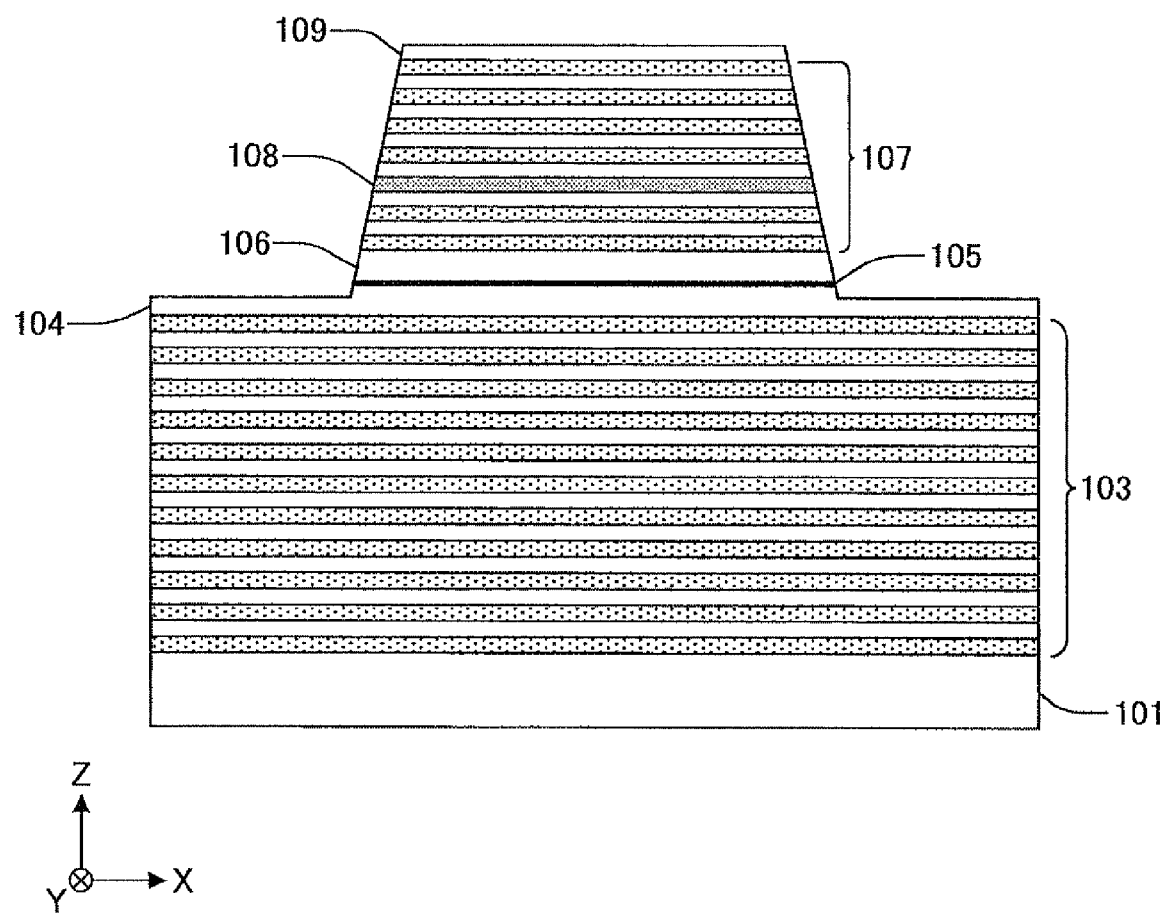
Figure 6A:
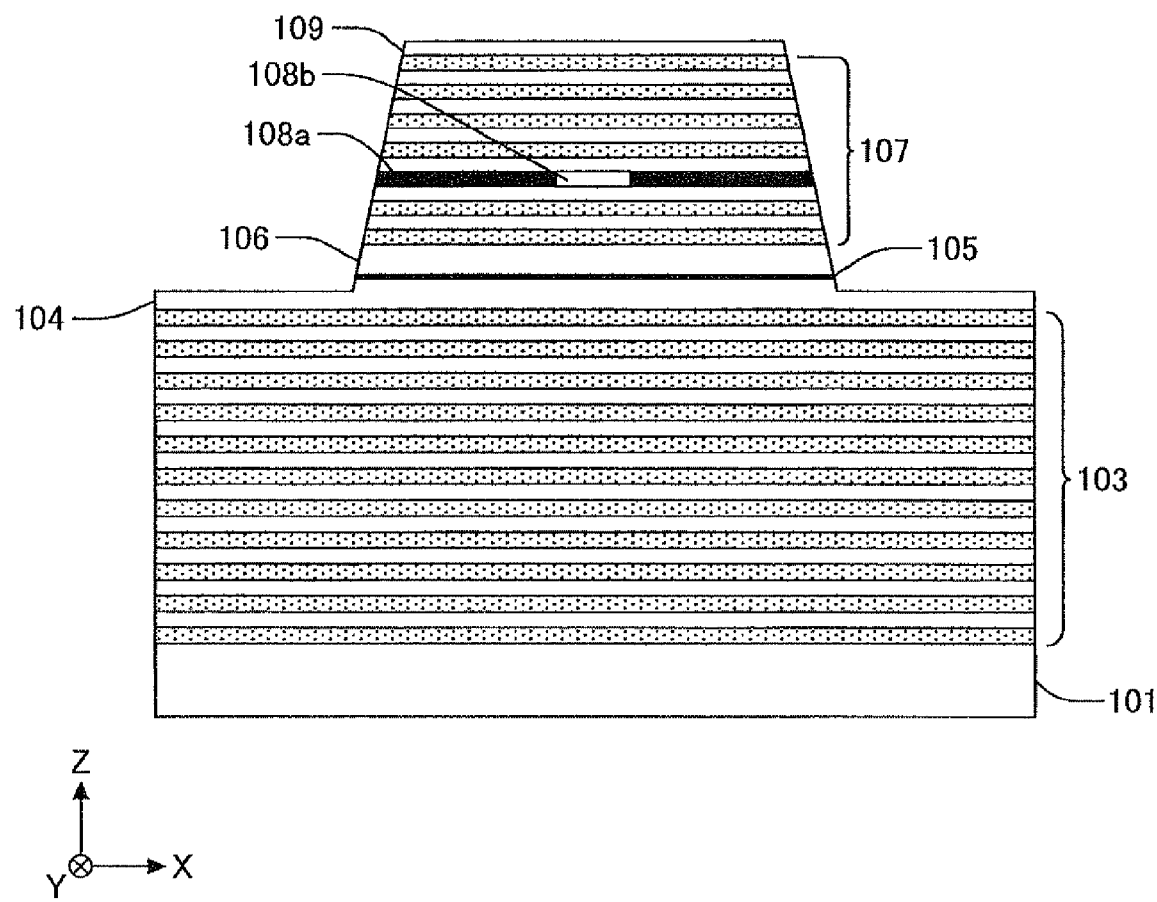
FIGS. 6A and 6B are further drawings illustrating the method of manufacturing the surface emitting laser device in FIG. 3.
Figure 6B:
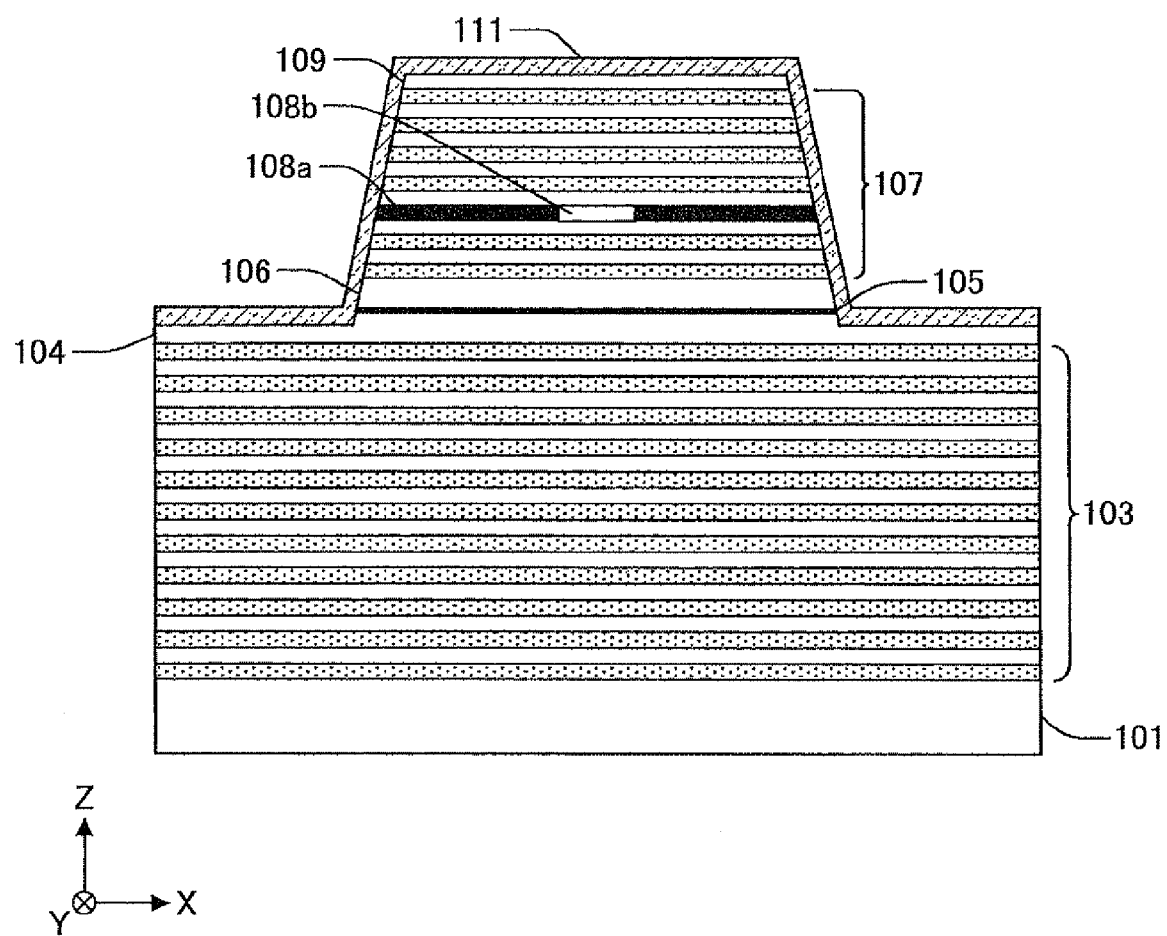

(1): The above laminated body is formed by crystal growth by the MOCVD (Metal Organic Chemical Vapor Deposition) method or the MBE (Molecular Beam Epitaxy) method (FIG. 5A).

Herein, in the case of MOCVD method, for example, trimethyl aluminum (TMA), trimethyl gallium (TMG), or trimethyl indium (TMI) is used as a group III material. Further, phosphine ($PH_3$) or arsine ($AsH_3$) is used as a group V material. Carbon tetrabromide ($CBr_4$) or dimethylzinc (DMZn) is used as a p-type dopant material, and hydrogen selenide ($H_2Se$) is used as an n-type dopant material.

(2): A resist pattern having a square shape with one side having a length of L1 (in this case, 25 μm) is formed on the surface of the laminated body.

(3): By the ECR etching method using $Cl_2$ gas, a mesa structure (hereinafter may be simplified as a "mesa") having a square pillar shape is formed by using the resist pattern as a photomask. In this case, the etching is performed in a manner such that the bottom surface of the etching is positioned (formed) in the lower spacer layer 104.

(4): The photomask is removed (see FIG. 5B).

(5): The laminated body is heat-processed with water vapor. By doing this, Al (aluminum) in the selectively-oxidized layer 108 is selectively oxidized from the outer peripheral part of the mesa. Then, an unoxidized region 108b that remains unoxidized and that is surrounded by an Al-oxidized layer 108a is formed in the middle of the mesa (see FIG. 6A). By doing this, the so-called oxide-confined structure is formed so that the passage of the driving current of the light emitting section is limited to the middle region of the mesa. The unoxidized region 108b serves as the current passage region (current injection region). Herein, for example, the current passage region having a substantially square shape with a width of 4 μm is formed.

(6): A protection layer 111 made of SiN is formed using the CVD (Chemical Vapor Deposition) method (see FIG. 6B). In this case, the optical thickness of the protection layer 111 is set to λ/4. Specifically, since the refractive index "n" of SiN is 1.86 and the oscillation wavelength "λ" is 780 nm, the actual film thickness (=λ/4n) is set to approximately 105 nm.

Figure 7:
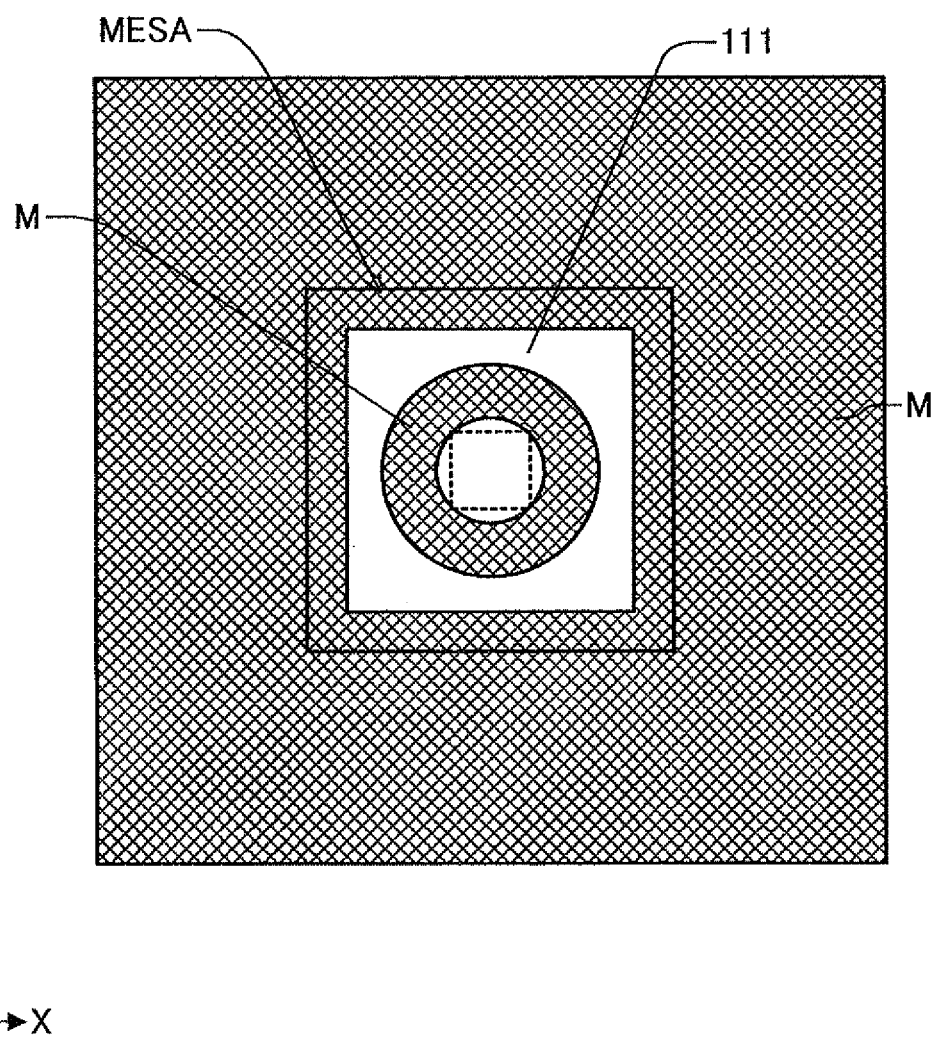
FIG. 7 is a drawing illustrating an etching mask.
Figure 8:
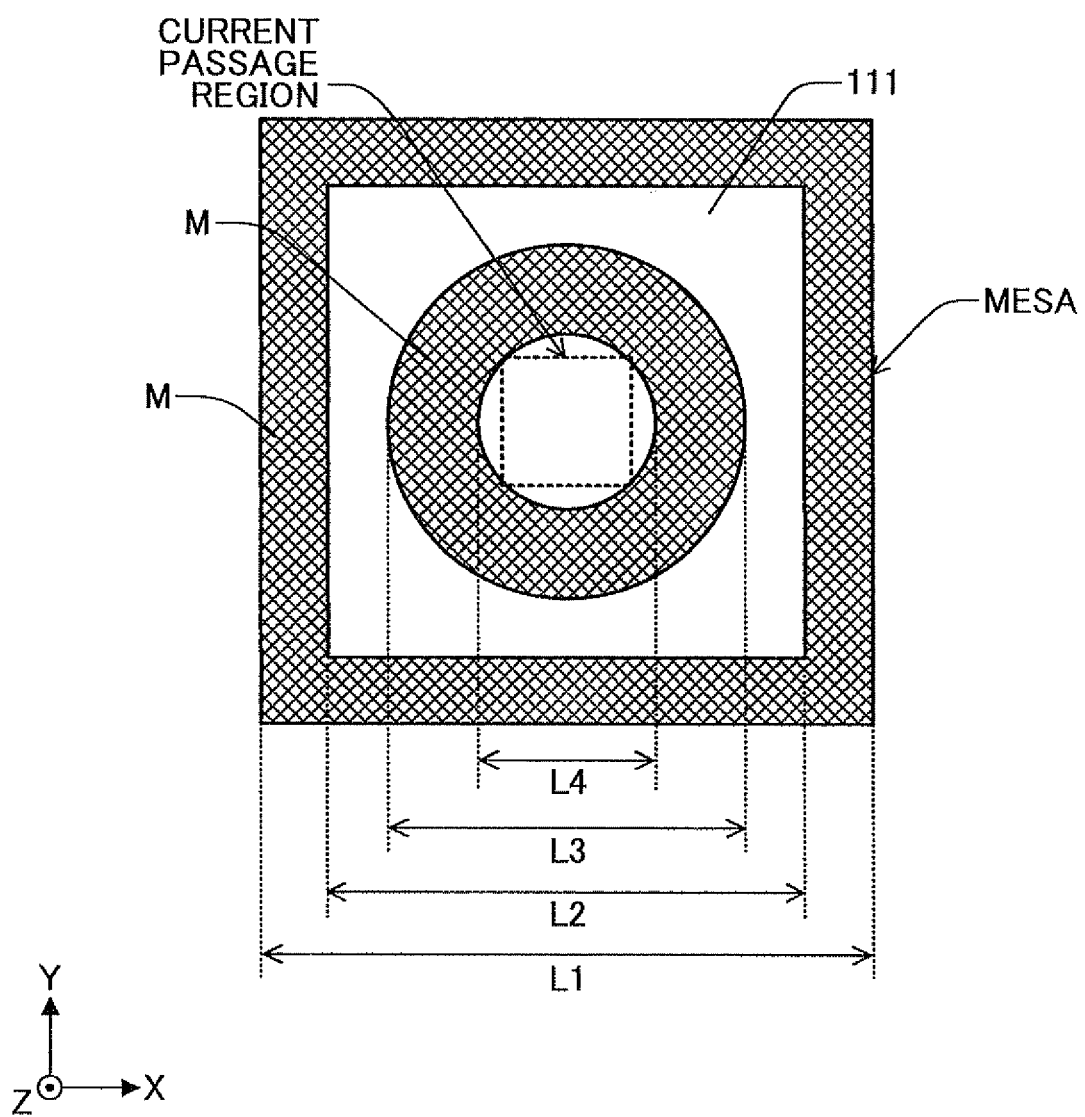
FIG. 8 is an enlarged view of the upper surface part of a mesa in FIG. 7.
Figure 9A:
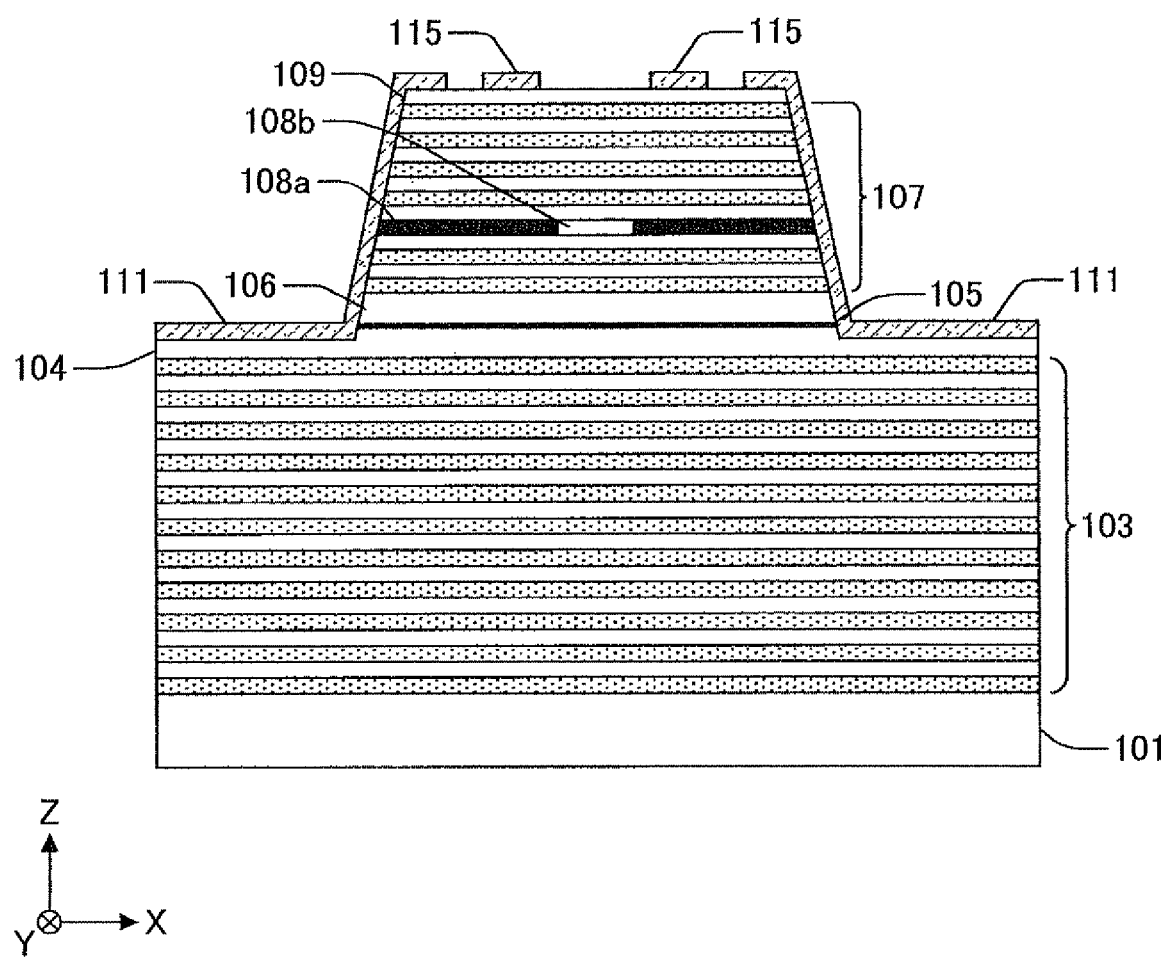
FIGS. 9A and 9B are further drawings illustrating the method of manufacturing the surface emitting laser device in FIG. 3.
Figure 9B:
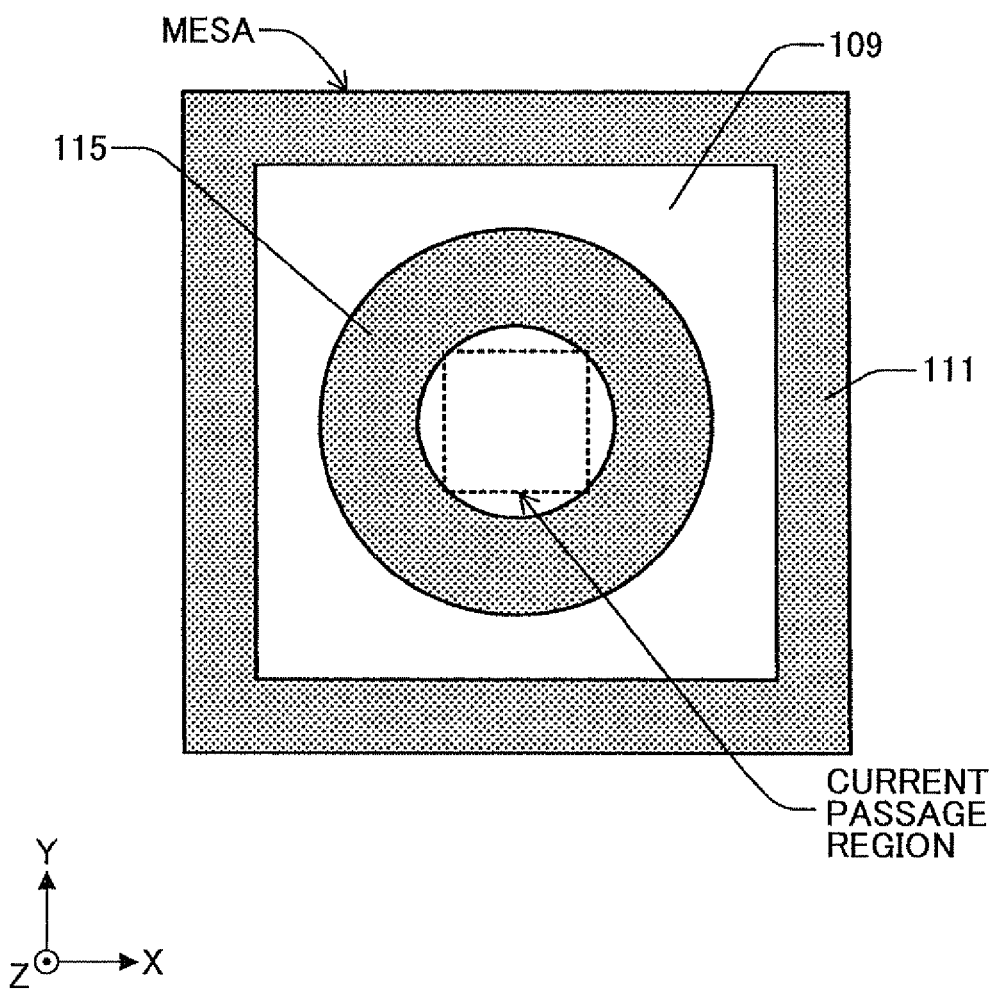

(7): An etching mask (a mask "M") for forming a window for p-side electrode contact (the p-side electrode 113) is formed on the upper part of the mesa which becomes the emitting surface of the laser light. Herein, as shown in FIG. 7 as an example, the mask "M" is formed to prevent a circular region where mode filter 115 is to be formed, surroundings of the mesa, a side surface of the mesa, and an outer periphery of the upper surface of the mesa from being etched. FIG. 8 is an enlarged view of the upper surface part of the mesa in FIG. 7. In this example, the inner diameter "L4" and the outer diameter and "L3" of the circular ring shaped region are set to 5 μm and 16 μm, respectively. Namely, the width of the circular region becomes 5.5 μm. Further, the outer shape of the area where the p-side electrode 113 is in contact with the contact layer 109 is square. The length "L2" of the one side of the square is 20 μm. In this case, the square may have round corners. Further, in the example of FIG. 8, the length "L1" is 25 μm.

(8) The protection layer 111 is etched by using buffered hydrofluoric acid (BHF) to form the window for the p-side electrode contact.

(9): The mask "M" is removed (see FIGS. 9A and 9B). In this case, the part of the protection layer 111 remaining in the emitting region becomes the mode filter 115.

(10): A resist pattern having a square pattern with one side having a length of L5 (in this case, 10 μm) is formed in a region where the light emitting section is to be formed on the upper side of the mesa, so that p-side electrode material is evaporated. As the p-side electrode material, a multilayer film made of Cr/AuZn/Au or a multilayer film made of Ti/Pt/Au is used.

Figure 10A:
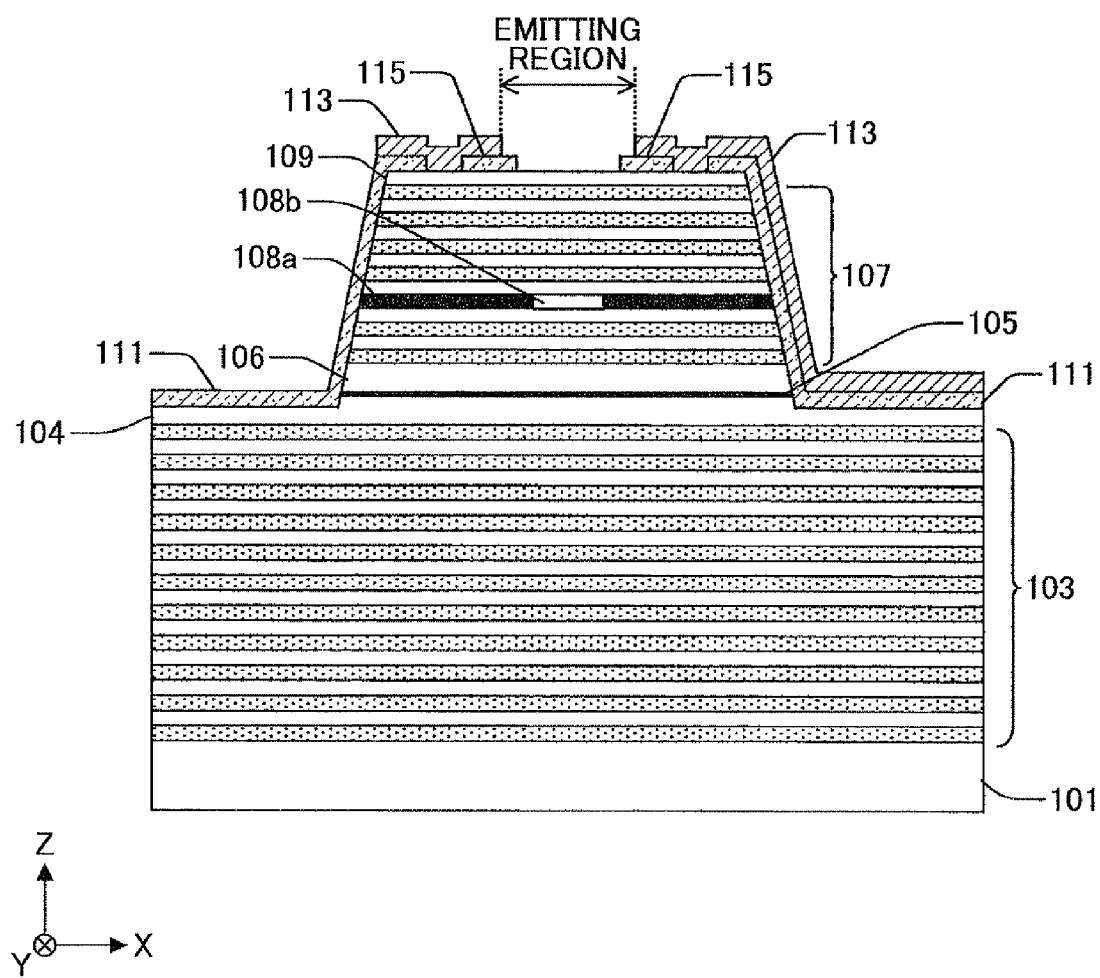
FIGS. 10A and 10B are further drawings illustrating a method of manufacturing the surface emitting laser device in FIG. 3.
Figure 10B:
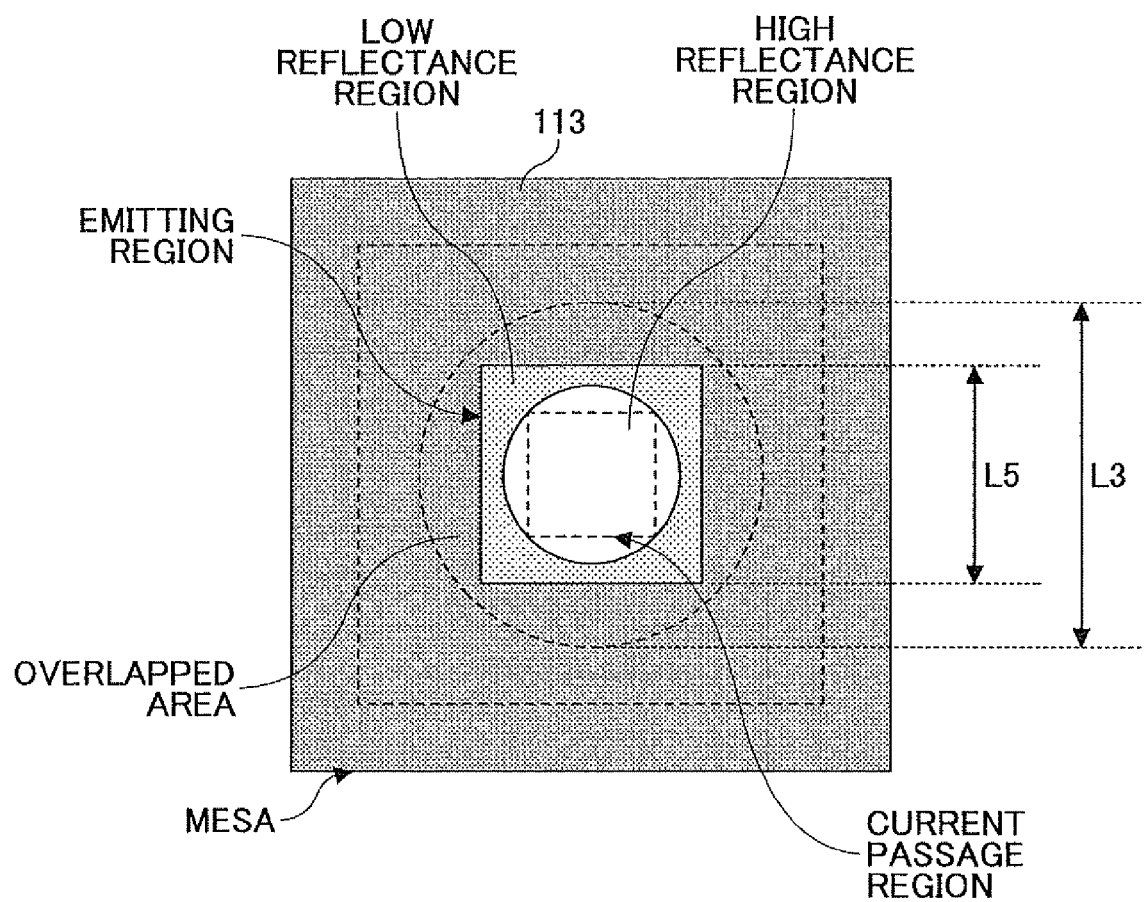

(11): The electrode material of the light emitting section is lifted off to form the p-side electrode 113, the electrode material having been evaporated in the emitting region (see FIG. 10A). Herein, the region surrounded by the p-side electrode 113 is the emitting region. FIG. 10B is an enlarged view of the upper surface part of the mesa in FIG. 10A. The shape of the emitting region is a square with one side length "L5" (in this case, 10 μm). In this embodiment, in the emitting region, there is the mode filter 115 (which may also be referred to as the dielectric film 115) made of SiN and having the optical thickness of λ/4. By having the mode filter 115 in the emitting region, the reflectance of the region where the mode filter 115 exists becomes less than that of the center part of the emitting region. In other words, in this embodiment, in the emitting region, there are a low reflectance region and a high reflectance region.

Figure 11:
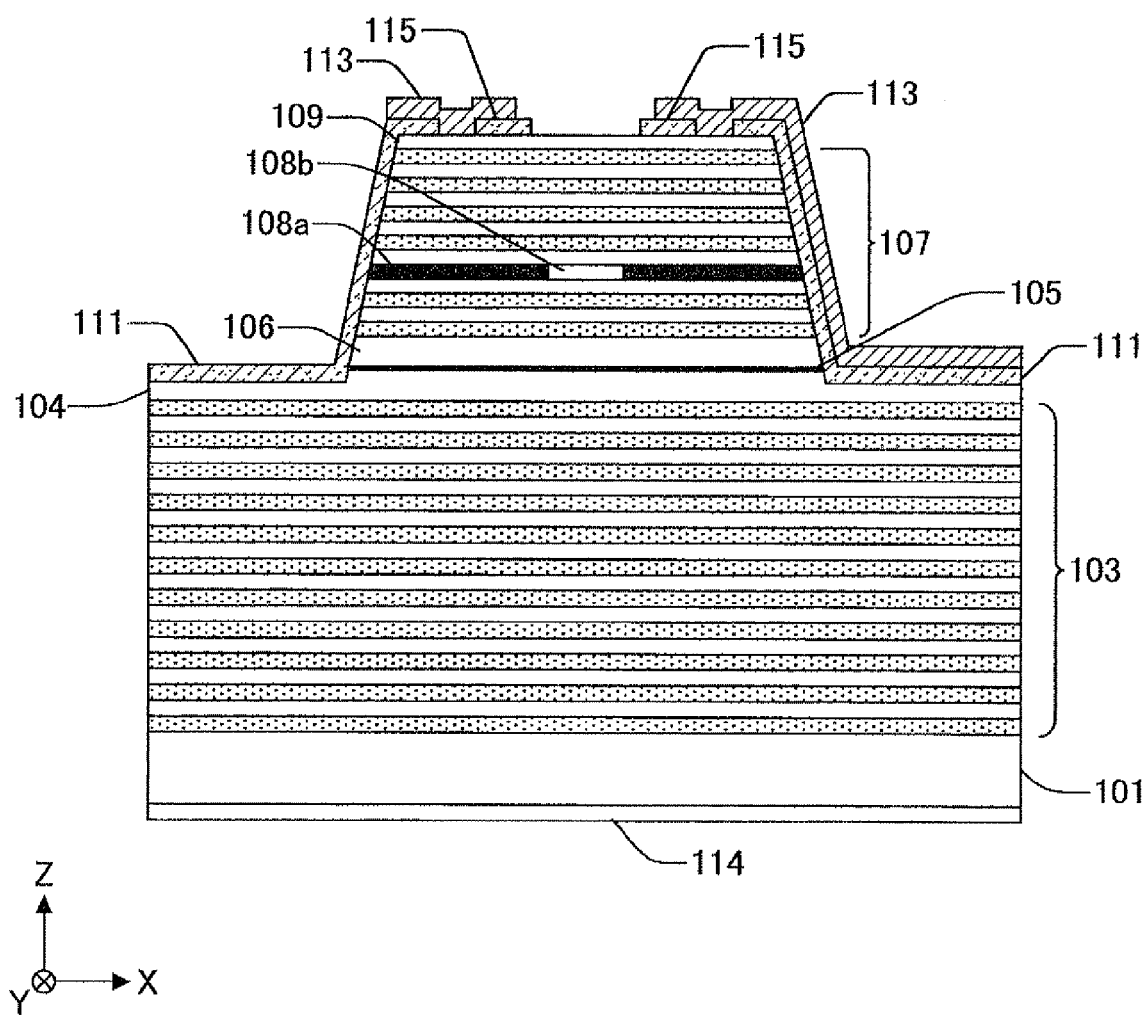
FIG. 11 is a further drawing illustrating the method of manufacturing the surface emitting laser device in FIG. 3.

(12) After polishing the rear side of the substrate 101 so as to have a predetermined thickness (for example, about 100 μm), the n-side electrode 114 is formed (see FIG. 11). In this case, the n-side electrode 114 is a multilayer film made of AuGe/Ni/Au.

(13): An annealing process is performed so as to have ohmic continuity between the p-side electrode 113 and the n-side electrode 114. By doing this the mesa becomes the light emitting section.

(14) The wafer is cut into chips.

After various post processes are performed on the chips, the surface emitting laser devices 100 are manufactured.

Generally, in the fundamental lateral mode, the light output becomes greater in the vicinity of the center of the emitting region. In contrast, in high-order lateral modes, though it depends on the modes, the light output becomes greater in the surrounding part of the emitting region.

Normally, in the first-order lateral mode, which most greatly influences the output of the fundamental lateral mode, there is a tendency that the highest output is observed in the surrounding part and that the output is decreased as approaching the center of the emitting region.

In the surface emitting laser devices 100 according to this embodiment of the present invention, as described above, when viewed from the emitting direction of the light beam, in the emitting region, the reflectance in the region in the surrounding part is less than the reflectance of the center part. By having this feature, it may become possible to reduce the reflectance of the high-order lateral modes without greatly reducing the reflectance of the fundamental lateral mode. As a result, it may become possible to suppress the oscillation of the high-order lateral modes.

Further, in the surface emitting laser devices 100, when viewed from the emitting direction of the light beam, a part of the mode filter 115 is overlapped by a part of the p-side electrode 113. By having this feature, the mode filter 115 is unlikely to be peeled off and long-term reliability may be obtained.

As described above, in the surface emitting laser devices 100 according to this embodiment of the present invention, the oscillator structure including the lower semiconductor DBR 103, the active layer 105, the upper semiconductor DBR 107, the contact layer 109 and the like are laminated on the substrate 101. Further, the p-side electrode 113 is provided on the emitting surface of the laser light and surrounds the emitting region. Further, in the emitting region, the mode filter 115 is formed that is a dielectric film formed so as to surround the center part of the emitting region and that has the optical thickness of $\lambda/4$.

Further, when viewed from the emitting direction of the light beam, the p-side electrode 113 is formed in a manner such that a part of the p-side electrode 113 overlaps a part of the mode filter 115. In this case, the long-term reliability of the surface emitting laser devices 100 may be improved while suppressing the oscillation of the high-order lateral modes.

Further, in the optical scanning device 1010 according to an embodiment of the present invention, the light source 14 includes the surface emitting laser devices 100. Therefore, it may become possible to perform stable optical scanning.

Further, in the laser printer 1000 according to an embodiment of the present invention, the laser printer 1000 includes the optical scanning device 1010. Therefore, it may become possible to form a high-quality image.

In the above embodiment, a case is described where the protection layer 111 is made of SiN. However, the present invention is not limited to this configuration. For example, the protection layer 111 may be made of any of SiNx, SiOx, TiOx, and SiON. By appropriately determining the film thickness based on the refractive index of the material, the same effect may be obtained.

Further, in the above embodiment, a case is described where the low reflectance region surrounds the center part of the emitting region and the low reflectance region has a circular ring shape with a uniform width. However, the present invention is not limited to the configuration.

Figure 12:
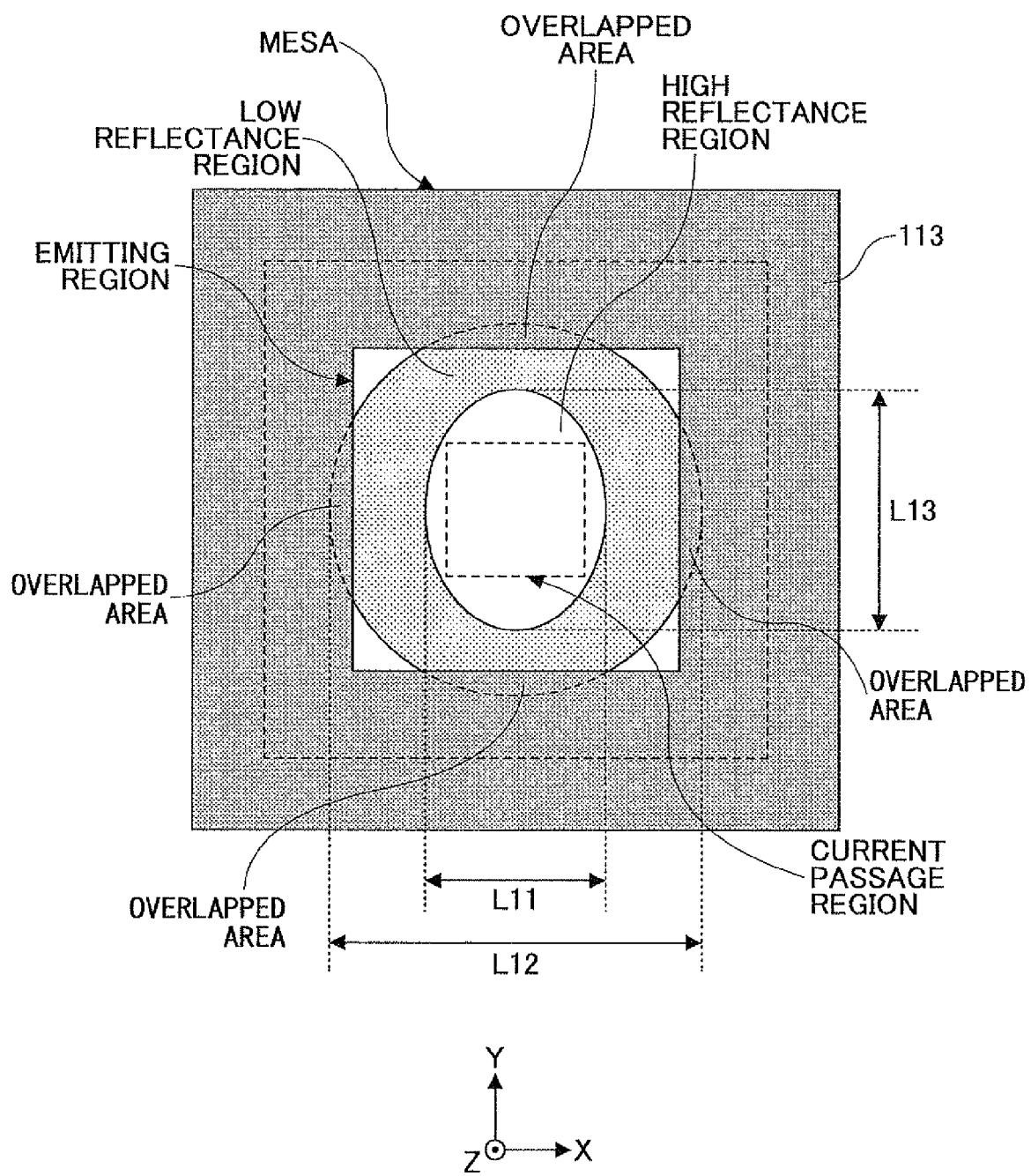
FIG. 12 is a drawing illustrating a first modification of a mode filter.

For example, as shown in FIG. 12, the low reflectance region may have an elliptic ring shape surrounding the center part of the emitting region. In the case of FIG. 12, the lengths "L11", "L12", and "L13" are 5 μm, 12 μm, and 8 μm, respectively.

Figure 13:
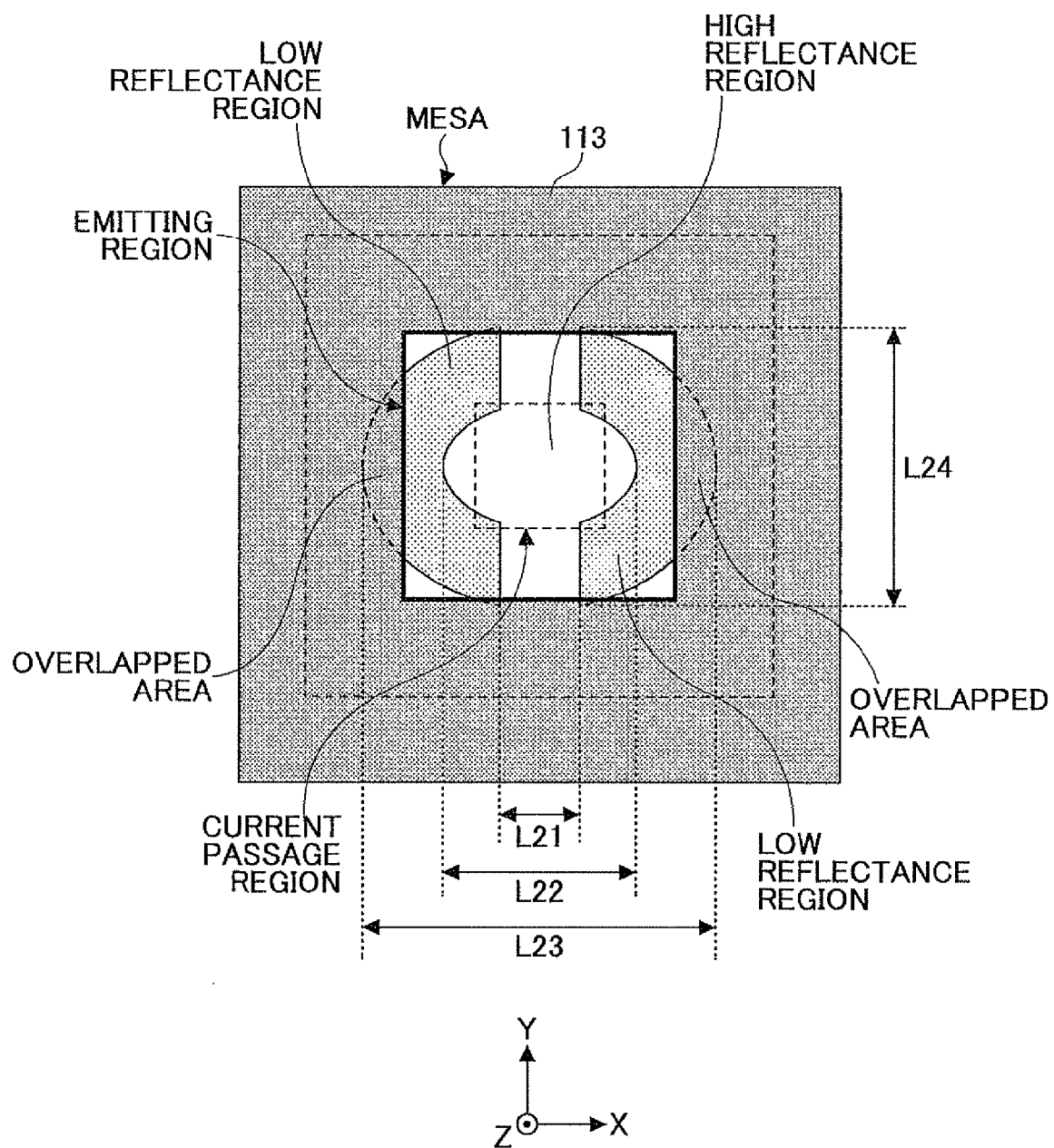
FIG. 13 is a drawing illustrating a second modification of the mode filter.

Further, as an example shown in FIG. 13, the low reflectance region may be formed into separated plural small regions (in case of FIG. 13, two small regions). In the case of FIG. 13, the lengths "L21", "L22", "L23", and "L24" are 2 μm, 5 μm, 12 μm and 12 μm, respectively. In this case, when compared with the case where the shape of the low reflectance region is an isotropic shape as in the above-described embodiment, a ratio of light intensity in a desired polarization direction to light intensity in a direction perpendicular to the desired polarization direction (i.e., polarization mode suppression ratio (PMSR)) may be improved.

This is because it is thought that anisotropy of a light confinement effect occurs between the two directions orthogonal to each other (in this case, the X axis direction and the Y axis direction). In this case, due to the light confinement effect, light having the polarization direction equal to the X axis direction tends to be confined in the center part of the emitting region, the center part having the higher refractive index than that in the surrounding part of the emitting region. As result, an oscillation threshold value of the light having the polarization direction equal to the X axis direction may be lowered when compared with a light having the polarization direction equal to the Y axis direction. Therefore, it is thought that the polarization mode suppression ratio (PMSR) is improved.

Namely, by having the plural low reflectance regions and causing the mode filter 115 to have shape anisotropy, it may become possible to cause the confinement effect in the lateral directions to have anisotropy. As a result, when there are a polarization direction having higher confinement effect and a polarization direction having lower confinement effect, the polarization direction having higher confinement effect is more likely to be oscillated than the polarization direction having lower confinement effect. Therefore, it may become possible to select the polarization direction having higher confinement effect as the polarization direction of the light.

Further, in this case, the shape of the mode filter is not limited to the shape shown in FIG. 13 where the circular-ring-shaped mode filter is separated into two regions disposed in the X axis direction. The mode filter may include plural regions divided or separated from one mode filter having an arbitrary shape such as a square shape or an elliptic shape. Further, the materials of the dielectric layers formed in the low reflectance regions may be the same as each other or different from each other.

Further, when one low reflectance region is formed, with respect to two directions orthogonal to each other, the distances in the two directions from the center of the emitting region may be different from each other or the widths in the two directions may differ from each other, so that the low reflectance region has shape anisotropy. By doing in this way, it may become possible to improve the polarization mode suppression ratio (PMSR).

Further, the substrate 101 may be a so-called off-axis substrate. When the off-axis substrate is used, the polarization direction may become stable and the polarization mode suppression ratio (PMSR) may also to improved. Herein, the term "polarization mode suppression ratio (PMSR)" refers to a ratio of light intensity in a desired polarization direction to light intensity in a direction perpendicular to the desired polarization direction.

For example, a surface emitting laser device has a similar configuration to that of the surface emitting laser device as illustrated in FIG. 13 except that there is no mode filter. Mainly because of an effect of the off-axis substrate, along with an effect of the distortion of the active layer and the like, the light is polarized in the direction (X axis direction in FIG. 13) perpendicular to the off-axis direction of the substrate. The polarization mode suppression ratio (PMSR) in this case is in a range from 20 dB to 30 dB.

Further, in the above-described circular-ring-shaped surface emitting laser device as shown in FIG. 10B, the light is more likely to be polarized in the off-axis direction of the substrate (Y axis direction in FIG. 13). The polarization mode suppression ratio (PMSR) in this case is reduced to a range from 10 dB to 20 dB.

Further, when the mode filter as shown in FIG. 13 is formed, the light is more likely to be polarized in the direction perpendicular to the off-axis direction of the substrate (X axis direction in FIG. 13). The polarization mode suppression ratio (PMSR) in this case is in a range from 20 dB to 30 dB. Namely, when compared with a case where a mode filter having a symmetrical shape (i.e., having no anisotropy) is formed, the polarization mode suppression ratio (PMSR) may be improved.

Further, in the above embodiment, a case is described where the optical thickness of the mode filter 115 is $\lambda/4$. However, the present invention is not limited to this configuration. For example, the optical thickness of the mode filter 115 may be any odd multiple of $\lambda/4$.

Figure 14:
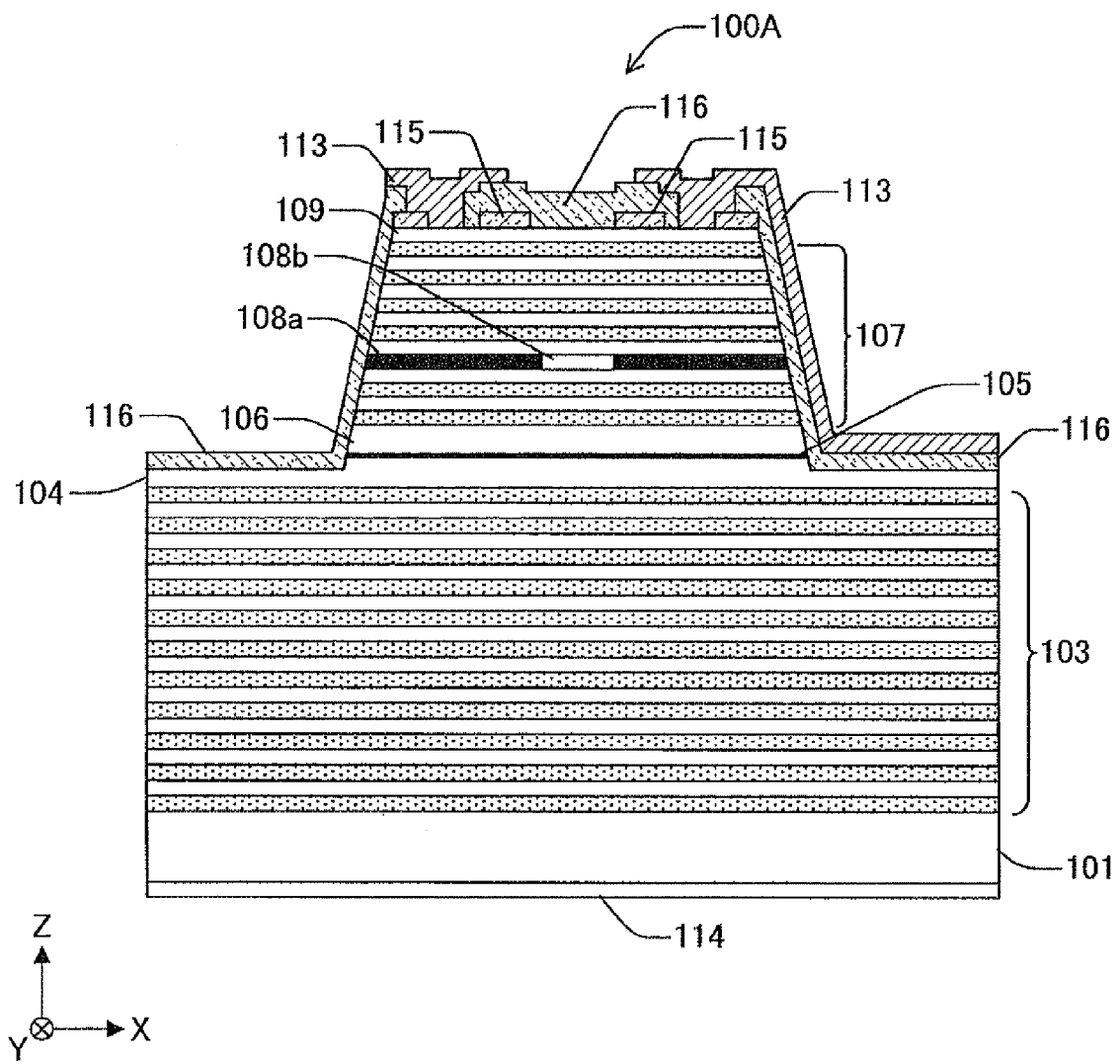
FIG. 14 is a drawing (1) illustrating a first modification of the surface emitting laser device.
Figure 15:
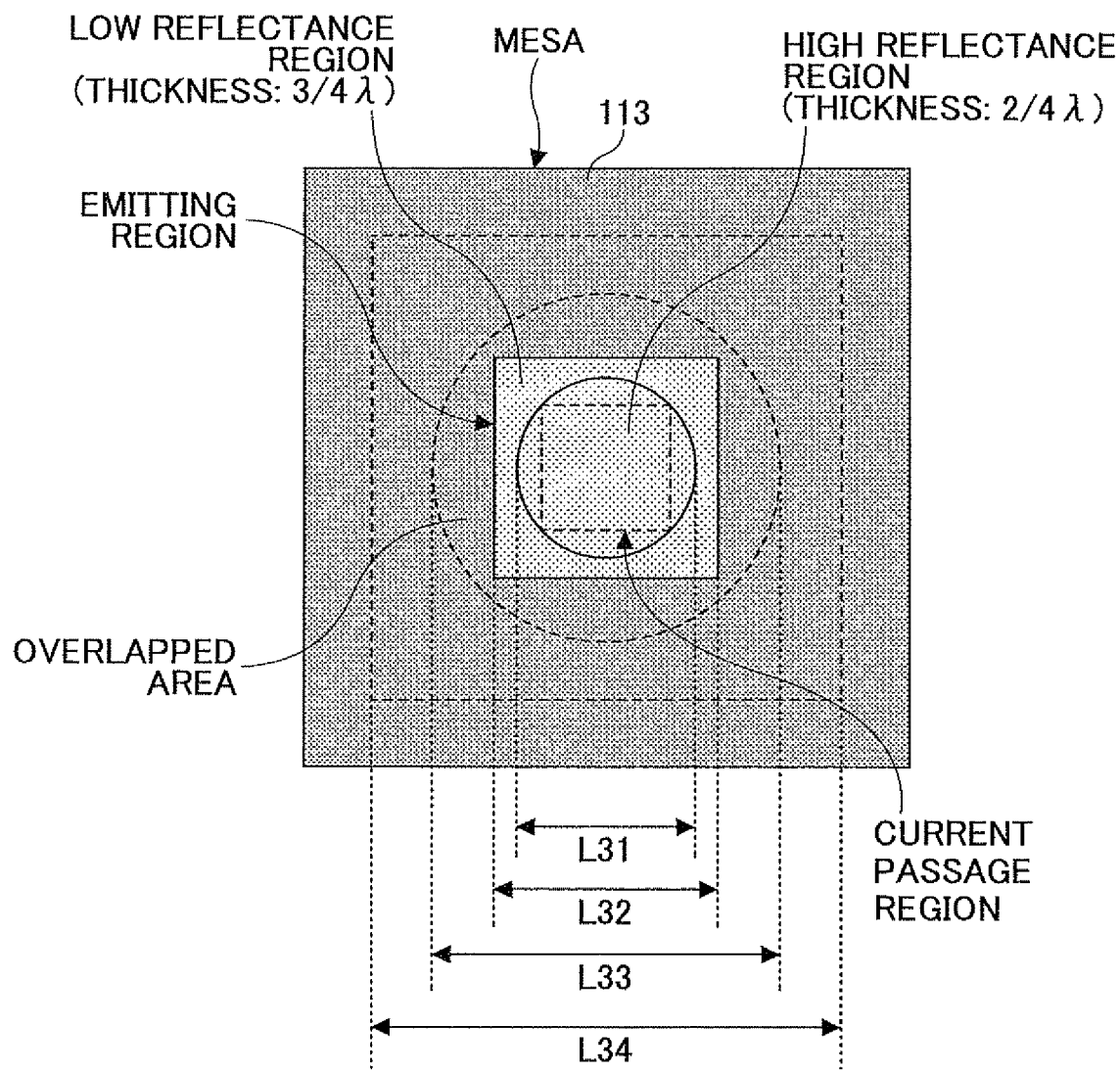
FIG. 15 is another drawing (2) illustrating the first modification of the surface emitting laser device.

Further, in the above embodiment, instead of using the surface emitting laser device 100, as shown in FIGS. 14 and 15 as an example, a surface emitting laser device 100A further including a dielectric film 116 formed on the entire surface of the emitting region may be used, the dielectric film 116 being made of SiN and having the optical thickness of $2\lambda/4$. Since the refractive index "n" of SiN is 1.86 and the oscillation wavelength "A" is 780 nm, the actual film thickness of the dielectric film 116 is set to approximately 210 nm. In the case of FIG. 15, the lengths "L31", "L32", "L33", and "L34" are 5 μm, 10 μm, 16 μm, and 20 μm, respectively.

In this case, the center part of the emitting region is covered (coated) with the dielectric film 116 made of SiN and having the optical thickness of $2\lambda/4$. Further, the mode filter includes the dielectric film 115 made of SiN and having the optical thickness of $\lambda/4$ and the dielectric film 116 made of SiN and having the optical thickness of $2\lambda/4$. As a result, the mode filter is made of the dielectric film made of SiN and having the optical thickness of $3\lambda/4$.

Further, the mode filter in this case is made of two dielectric layers of the same material. Because of this feature, no reflection may occur at the boundary surface between the dielectric film 115 made of SiN and having the optical thickness of $\lambda/4$ and the dielectric film 116 made of SiN and having the optical thickness of $2\lambda/4$. As a result, the high-order modes may be effectively suppressed.

In this case, the entire emitting region is covered with the dielectric film 116. Therefore, the oxidization and the contamination of the emitting region may be suppressed (prevented). Further, in this case, the center part of the emitting region is covered with the dielectric film 116. However, the optical thickness of the dielectric film 116 is set to an even multiple of "$\lambda/2$". Therefore, in this case, without reducing the refractive index, the same optical characteristics as that in the case without dielectric film 116 may be obtained.

Namely, as long as the dielectric film has the optical length of an odd multiple of $\lambda/4$ in the part where the refractive index is to be reduced and has the optical length of an even multiple of $\lambda/4$ in the other parts, the similar effect to that of the surface emitting laser device 100 may be obtained.

Figure 16:
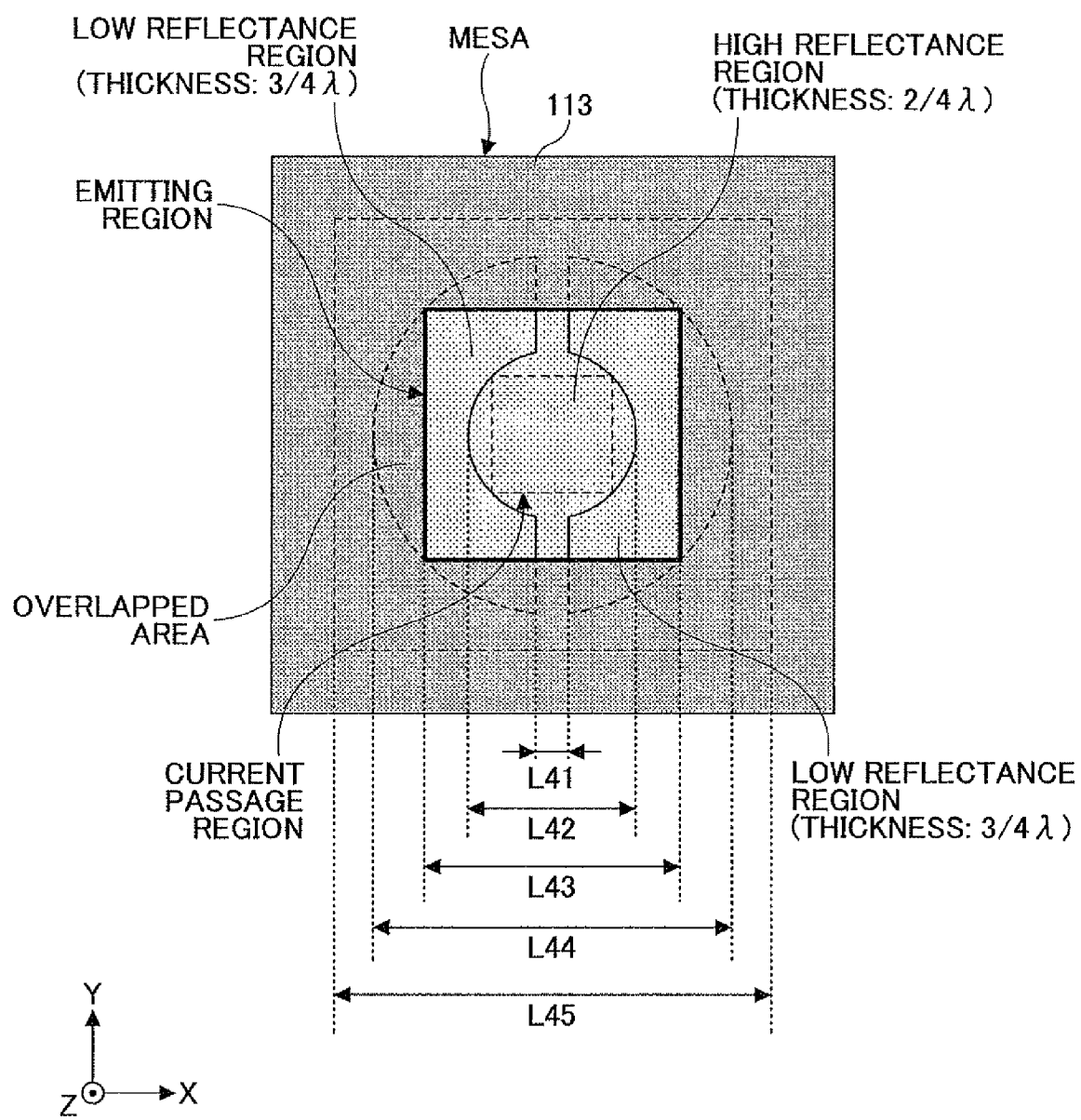
FIG. 16 is a drawing illustrating a modification of the mode filter in the first modification of the surface emitting laser device.

Further, in this case, as shown in FIG. 16 as an example, the mode filter may be separated into two small regions that are facing each other across the center part of the emitting region and that are formed at the positions separated from the center of the emitting region. In this case, on the upper surface of the mesa, the contact layer 109 may not be exposed. Namely, the entire upper and side surfaces of the mesa are fully covered with at least one of the p-side electrode and the dielectric film. Therefore, the oxidization and the contamination of the emitting regions may be suppressed, and the destruction of the device due to the water absorption (moisture absorption) may be suppressed. As a result, the long-term reliability may further be improved. In the case of FIG. 16, the lengths "L41", "L42", "L43", "L44", and "L45" are 2 μm, 5 μm, 10 μm, 16 μm, and 20 μm, respectively.

Further, in the example of FIG. 16, the mode filter has a shape which is formed by separating the circular ring shape into two parts. Also, since the lateral mode distribution is almost circular, in this case, the loss of the fundamental mode may be suppressed due to the low reflectance regions, and high-order modes may be effectively suppressed.

Figure 17:
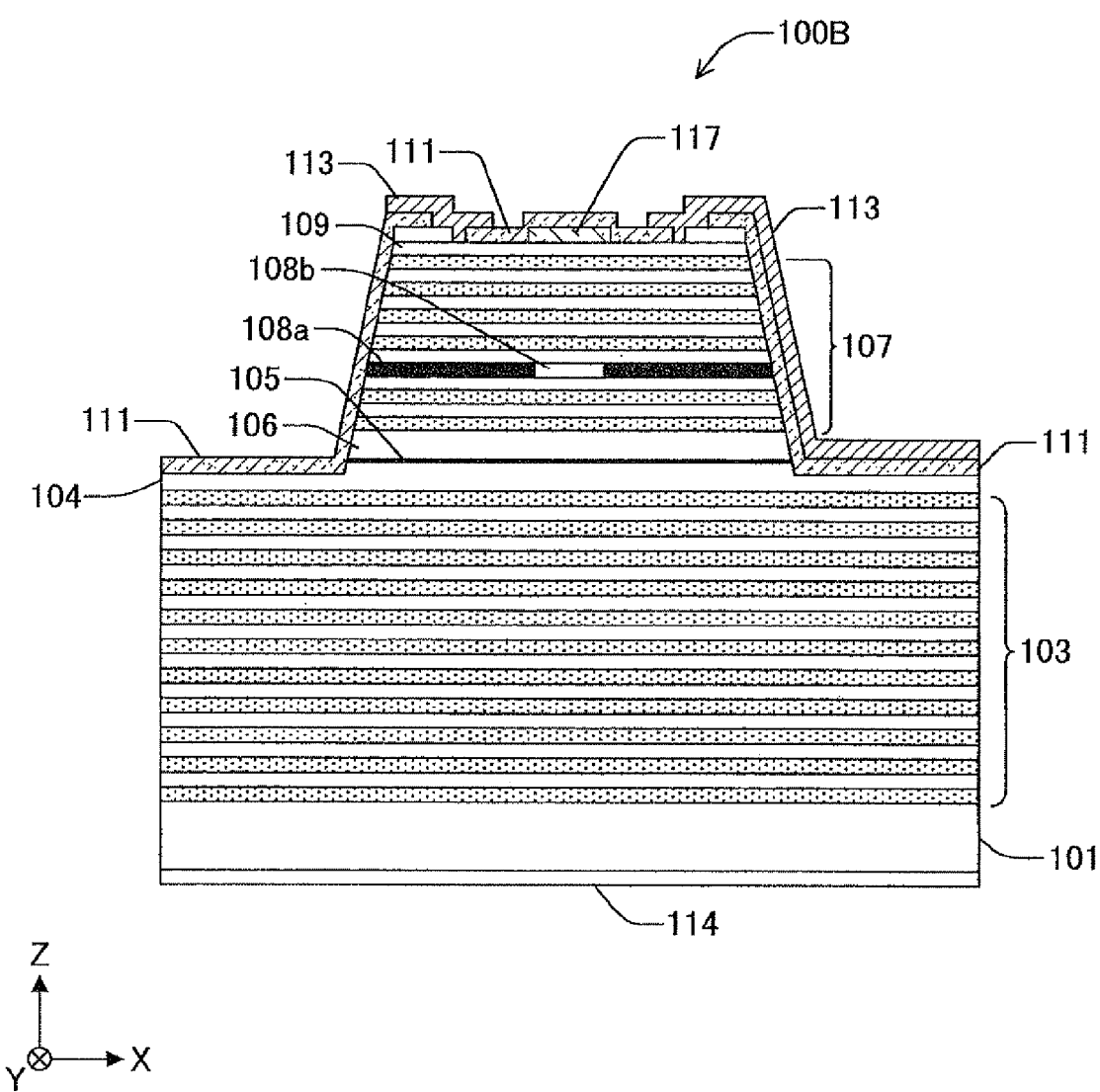
FIG. 17 is a drawing (1) illustrating a second modification of the surface emitting laser device.
Figure 18:
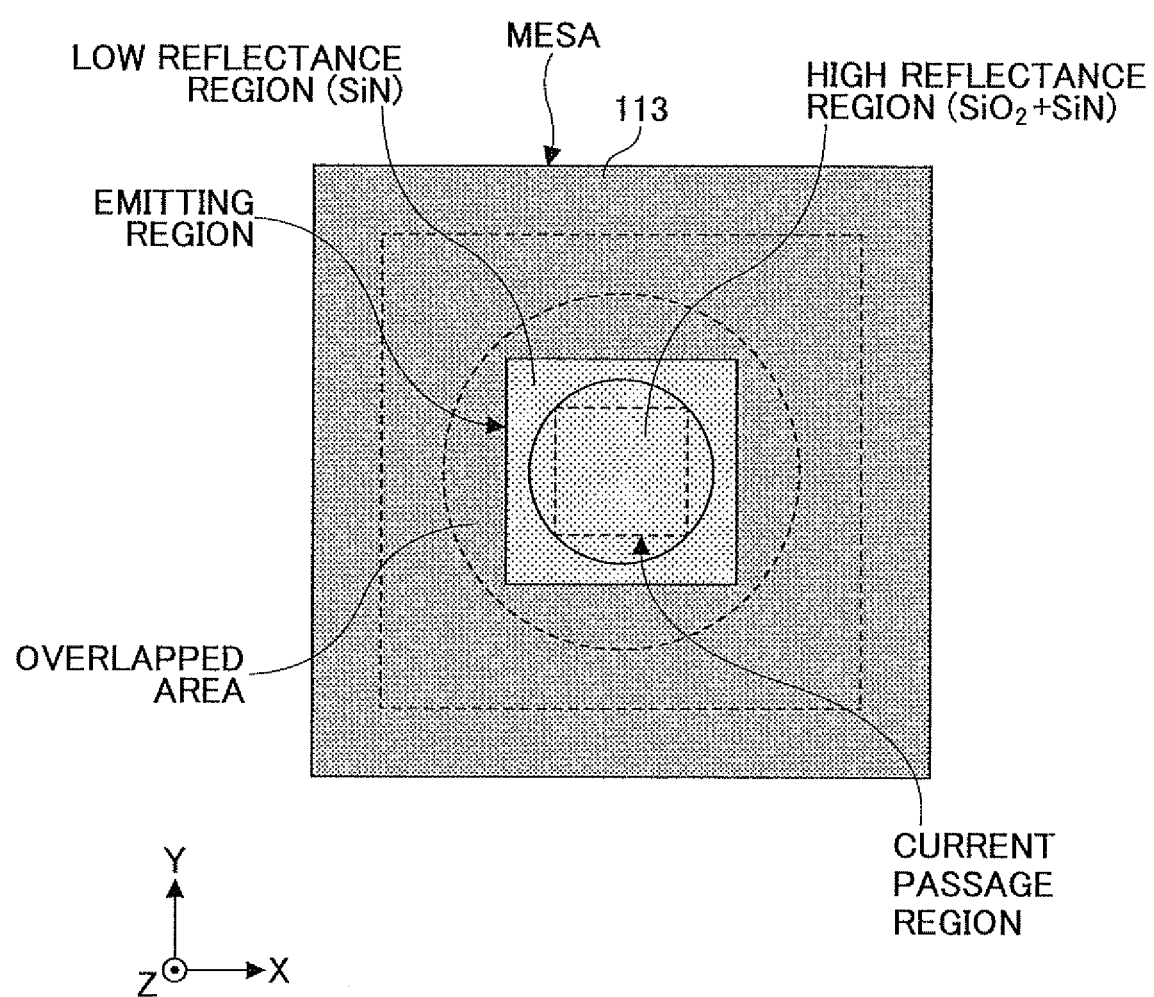
FIG. 18 is another drawing (2) illustrating the second modification of the surface emitting laser device.

Further, in the above embodiment, instead of using the surface emitting laser device 100, as shown in FIGS. 17 and 18 as an example, a surface emitting laser device 100B may be used in which a high reflectance region made of two dielectric layers is formed in the center part of the device and a low reflectance region made of one dielectric layer is formed in the region outside the center part. In this case, the optical thicknesses of the dielectric layers are set to an odd multiple of "$\lambda/4n$" ($\lambda$: oscillation wavelength, n: refractive index of the dielectric layer corresponding to the oscillation wavelength).

Herein, in the center part, on the contact layer 109, two types of dielectric layers, specifically, a dielectric layer made of $SiO_2$ and a dielectric layer made of SiN are laminated in this order from a lower layer. In this case, it may be necessary for the refractive index of a dielectric layer 117 which is the lower layer to be less than the refractive index of the protection layer 111 which is the upper layer. Though it may depend on film forming conditions, in this case, for example, the refractive index of $SiO_2$ of the lower layer of the dielectric layer 117 is approximately 1.5, and the refractive index of SiN of the upper layer of the protection layer 111 is approximately 1.86.

On the other hand, in the region outside the center part, only SiN is laminated. This part of the single layer made of SiN serves as the mode filter.

When the thicknesses of the dielectric layers are set as described above, the center part may have the same configuration as that of normal multilayer film reflection mirrors. Therefore, the reflectance may be increased. On the other hand, in the region outside the center part, one layer of the dielectric layer having the optical thickness of $\lambda/4n$ is formed on the multilayer film reflection mirror. Further, the refractive index of SiN is less than that of the semiconductor layers. Therefore, the reflectance of this region may be reduced.

As a result, in the surface emitting laser device 100B, the reflectance in the center part is increased (improved), thereby enabling increasing the difference between the reflectance in the center part and the reflectance in the region outside the center part.

Figure 19A:
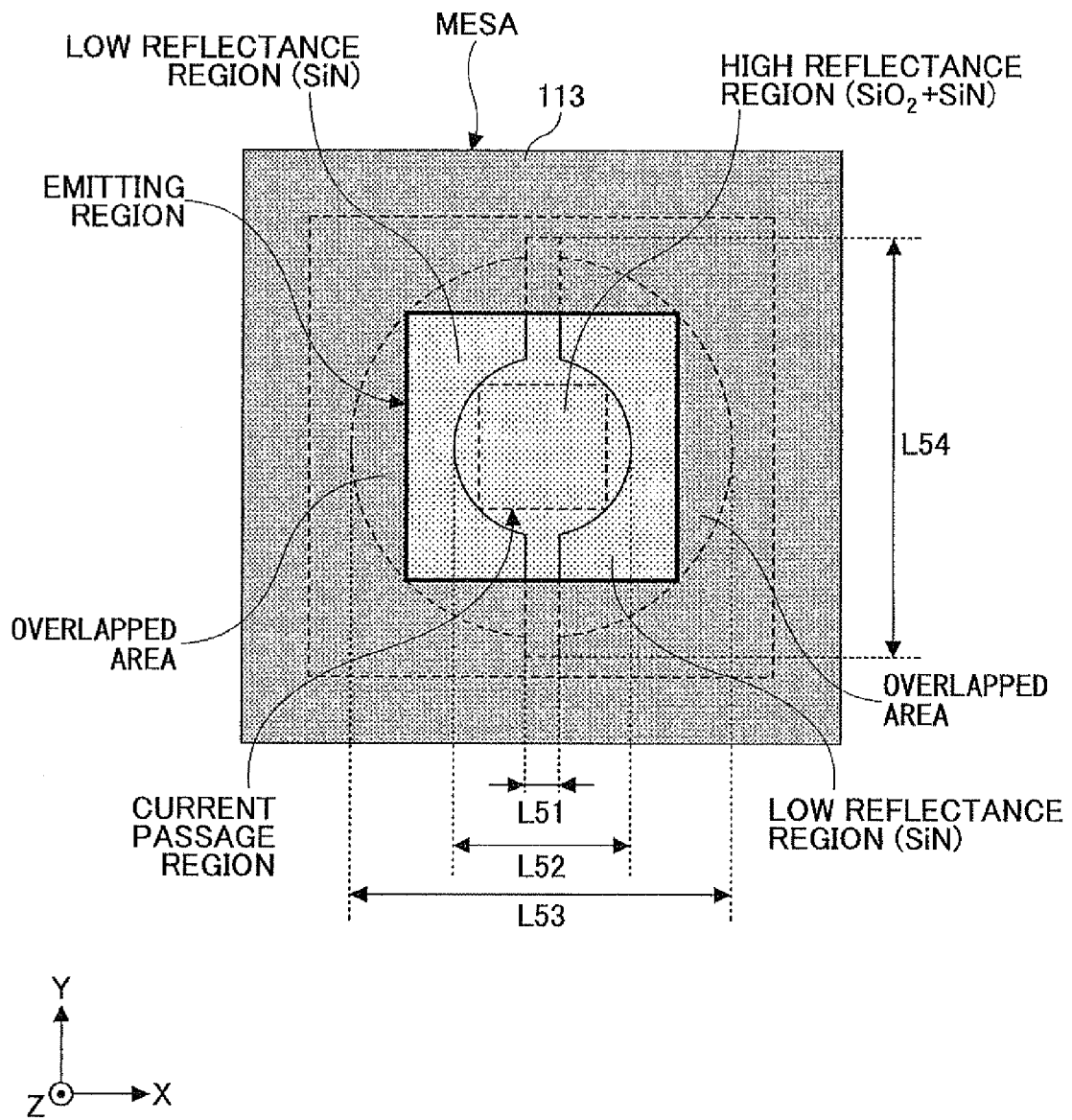
FIGS. 19A through 19C are drawings illustrating a modification of the mode filter in the second modification of the surface emitting laser device.
Figure 19B:
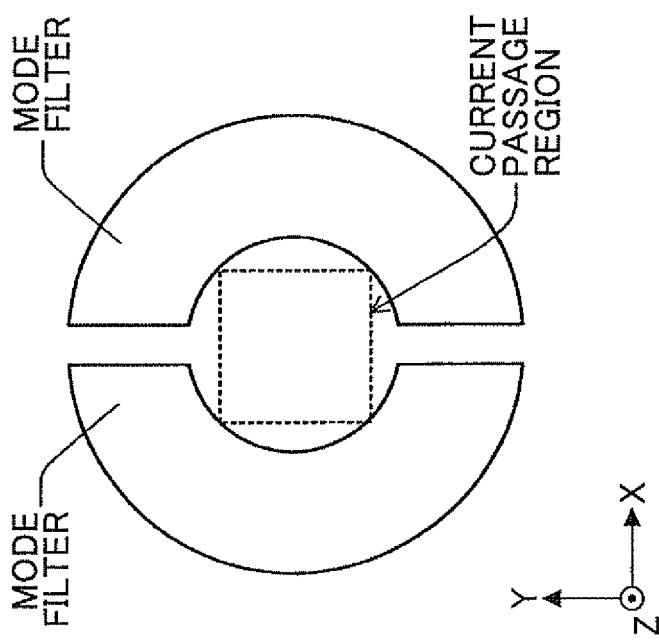
Figure 19C:
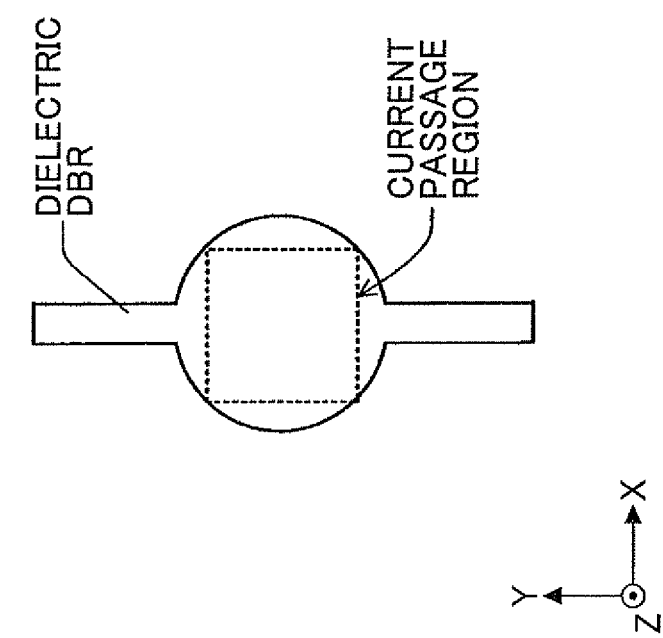

Further, in this case, as shown in FIG. 19A as an example, a dielectric DBR (dielectric layers in which $SiO_2$ and SiN are laminated) covering the center part of the emitting region may be formed so that the dielectric DBR has shape anisotropy. To that end, the mode filters (i.e., dielectric layers made of only $SiO_2$) may be formed in a manner such that the mode filters face each other across the center part of the emitting region and are disposed at the positions separated from the center part of the emitting region. By forming so that the dielectric DBR has shape anisotropy, the anisotropy of a light confinement effect occurs between the lateral directions. As a result, the polarization mode suppression ratio (PMSR) may be improved. In the case of FIG. 19A, the lengths "L51", "L52", "L53", and "L54" are 2 μm, 5 μm, 16 μm, and 18 μm, respectively. Further, FIG. 19B illustrates the dielectric DBR in FIG. 19A. Further, FIG. 19C illustrates the mode filters in FIG. 19A. Further, the substrate 101 may be the off-axis substrate.

Figure 20:
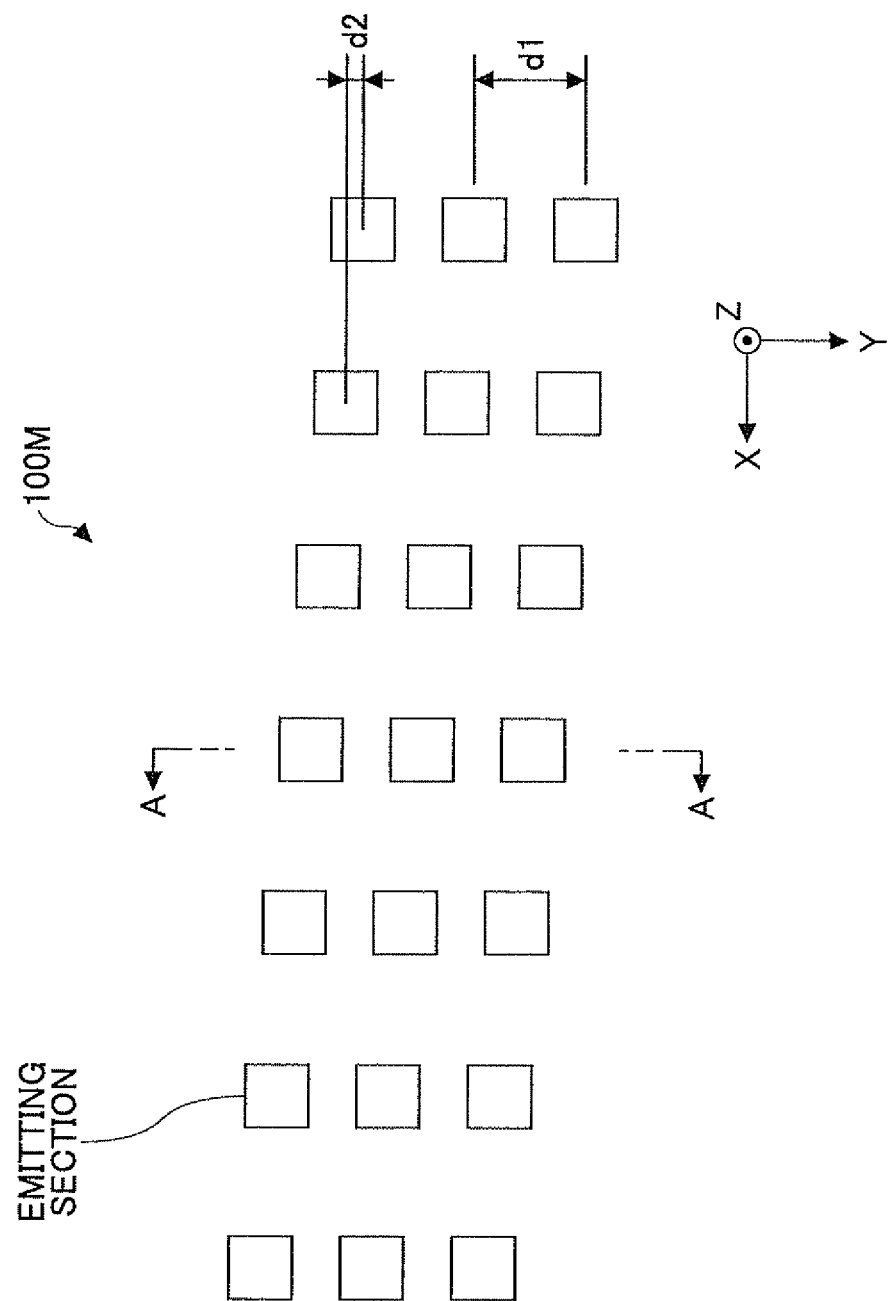
FIG. 20 is a drawing illustrating a surface emitting laser array.

Further, in the above embodiment, as shown in FIG. 20 as an example, the light source 14 may include a surface emitting laser array 100M instead of using the surface emitting laser device 100.

The surface emitting laser array 100M includes plural (21 in this case) emitting sections formed on the same substrate. In FIG. 20, the X axis direction corresponds to the main scanning direction, and the Y axis direction corresponds to the sub scanning direction. The plural emitting sections are arranged in a manner such that when all the emitting sections are orthographically projected on a virtual line extending in the Y axis direction, the distance between the adjacent emitting sections is equal to a constant distance "d2". Namely, those twenty one (21) emitting sections are two-dimensionally arranged. In this description, the distance between the adjacent emitting sections refers to the distance between the centers of adjacent emitting sections. Further, the number of the emitting sections is not necessarily limited to 21.

Figure 21:
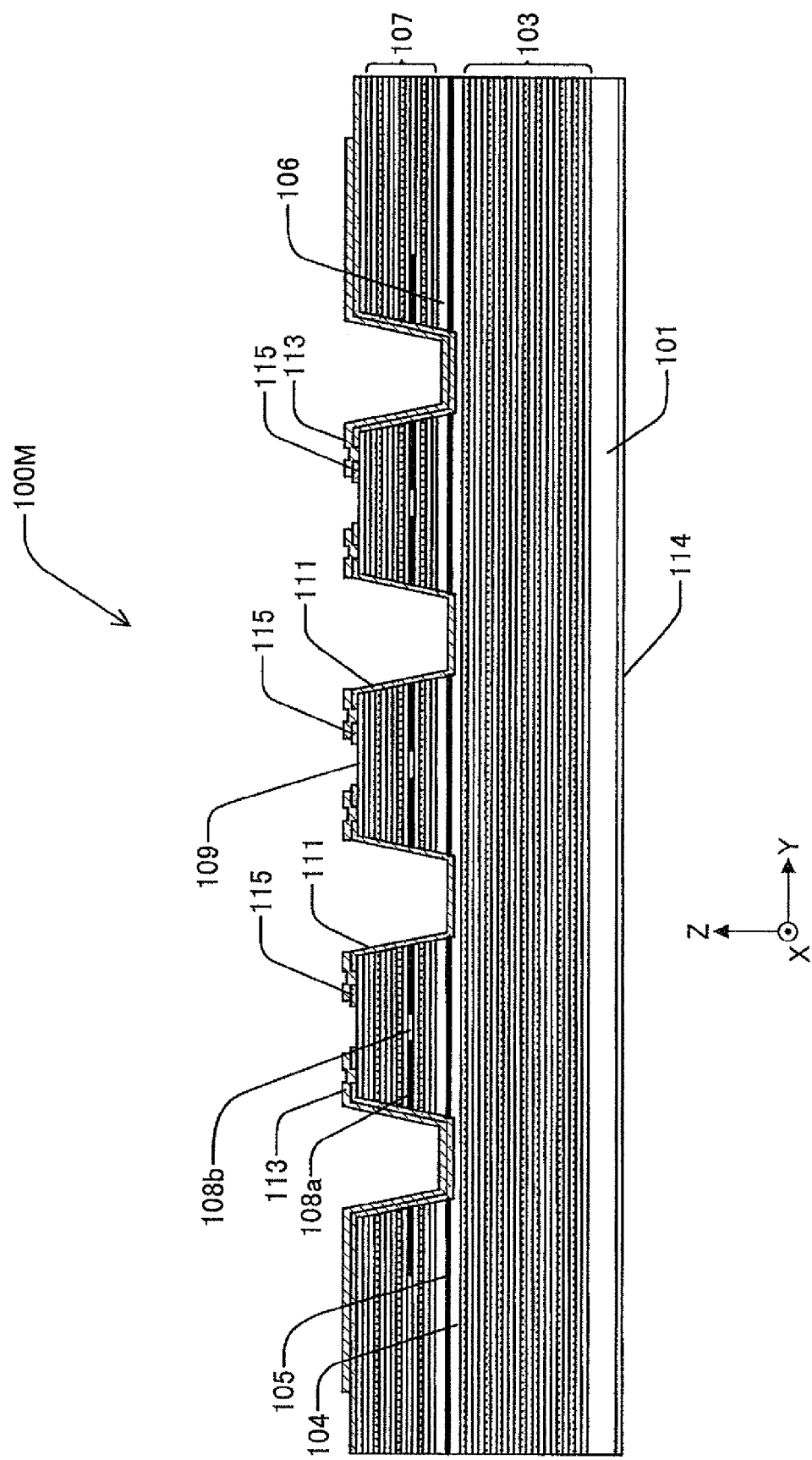
FIG. 21 is a cross-sectional view cut along the line A-A in FIG. 20.

As shown in FIG. 21, which is a cross-sectional view along the A-A line of FIG. 20, each of the emitting sections has a similar configuration to that of the surface emitting laser 100. Further, the surface emitting laser array 100M may be manufactured in a similar manner to that in manufacturing the surface emitting laser 100. Therefore, it may become possible to obtain plural laser lights having high single mode output. As a result, it may become possible to form twenty one (21) light spots having high light intensity on the photosensitive drum 1030 at the same time.

Further, in the surface emitting laser array 100M, when all the emitting sections are orthographically projected on a virtual line extending in the Y axis direction, the distance between the adjacent emitting sections is equal to a constant distance d2. Because of this configuration, by controlling the turn-on timings of the emitting sections, the configuration of the surface emitting laser array 100M may be regarded as a configuration where the emitting sections are arranged at regular intervals in the sub scanning direction on the photosensitive drum 1030.

Further, for example, when the distance d2 is set to 2.65 µm and the magnification of the optical system is set to 2 times, high density writing of 4800 dpi (dots per inch) may be achieved. Obviously, for example, the density may be further enhanced by increasing the number of the emitting sections in the main-scanning corresponding direction, by changing the array layout by reducing the pitch d1 (see FIG. 20) in the sub-scanning corresponding direction to further reduce the distance d2, or by reducing magnification of the optical system. As a result, higher quality printing may be achieved. Further, the writing distance in the main scanning direction may be easily controlled by controlling the turn-on timings of the emitting sections.

Further, in this case, even when the writing dot density is increased, the laser printer 1000 may perform printing without reducing the printing speed. Further, when assuming that writing dot density is to be maintained, the printing speed may be further increased. Further, the surface emitting laser device according to an embodiment of the present invention has high single mode output. Therefore, a faster printing speed and a high-resolution image may be obtained.

Further, in the above embodiment, instead of using the surface emitting laser device 100, a surface emitting laser array may have one-dimensionally arranged emitting sections each similar to those of any one of the surface emitting laser device 100, surface emitting laser device 100A and surface emitting laser device 100B.

Further, in the above embodiment, a case is described where the oscillation wavelength of the emitting section is 780 nm band. However, the present invention is not limited to this configuration. The oscillation wavelength may be changed in accordance with the characteristics of the photosensitive body.

Further, the above-described surface emitting lasers may also be used in applications other than an image forming apparatus. In such a case, the oscillation wavelength may be, for example, 650 nm band, 850 nm band, 980 nm band, 1.3 µm band, 1.5 µm band or the like. Further, in this case, as the semiconductor material used for the active layer, an appropriate mixed crystal semiconductor material in accordance with the oscillation wavelength may be used. For example, an AlGaInP-based mixed crystal semiconductor material may be used in 650 nm band; an InGaAs-based mixed crystal semiconductor material may be used in 980 nm band; and a GaInNAs(Sb)-based mixed crystal semiconductor material may be used in 1.3 µm band and 1.5 µm band.

Further, by appropriately selecting the material and the configuration of the reflection mirrors in accordance with the oscillation wavelength to be used, it may become possible to form the emitting section adapted to any of the oscillation wavelengths. For example, as the mixed crystal other than AlGaAs mixed crystal, AlGaInP mixed crystal or the like may be used. Further, preferably, the low reflectance region (layer) and the high reflectance region (layer) are formed by using materials that are transparent to the oscillation wavelength and the difference between the reflectance of the low reflectance region (layer) and the reflectance of the high reflectance region (layer) is large as much as possible.

In the above embodiment, a case is described where the optical scanning device 1010 is used in a printer. However, obviously, the optical scanning device 1010 may also be used in an image forming apparatus other than the printer. Namely the optical scanning device 1010 is used in image forming apparatuses including, for example, a copier, a facsimile machine, and a multi-function peripheral having those functions.

Further, in the above embodiment, a case is described where the image forming apparatus is the laser printer 1000. However, the present invention is not limited to this configuration.

Further, the image forming apparatus may include an image forming apparatus capable of directly irradiating a laser light on a medium (e.g., a sheet) having reversibility so that coloring/discoloring occurs on the medium based on the irradiated laser lights.

For example, the medium may be so-called rewritable paper. In such a medium, as a recording layer, a material described below is applied on a supporting body made of paper, resin film or the like. Then, by controlling thermal energy of the laser light, the coloring/discoloring operations may be reversibly performed on the medium.

There are a transparent-opaque type rewritable marking method and a coloring/discoloring type rewritable marking method using leuco dye. The present invention may be applied to any of those methods.

In the transparent-opaque type rewritable marking method, molecules of fatty acid are dispersed in a polymer thin film. When heated at a temperature equal to or higher than 110° C., resin expands due to melting of the fatty acid. After that, when cooled, the fatty acid is in a supercooled condition and remains in liquid form, and the expanded resin is solidified. After that, the fatty acid is solidified and shrinks to become polycrystalline molecules, thereby generating air gaps between resin and molecules. Due to the air gaps, light is scattered and white color is present. Next, when heated at a delete temperature range from 80° C. to 110° C., the fatty acid is partially melted and the resin thermally expands to fill the air gaps. Under this condition, when cooled, the transparent status appears and as a result, the image is deleted.

In the rewritable marking method using leuco dye, a reversible coloring/discoloring reaction is used based on a colorless leuco-type dye and a developing-decoloring agent having a long-chain alkyl group. In this method, when heated due to the laser light, the leuco dye and the developing-decoloring agent are reacted together to develop color. Then, when rapidly cooled, the developed color status is maintained. After that, when heated and then gradually cooled, due to the self-aggregation activity of the long-chain alkyl group of the developing-decoloring agent, the phase separation occurs. Namely, the leuco dye and the developing-decoloring agent are physically separated and as a result, the color disappears.

Further, the medium may be so-called color rewritable paper in which photochromic compounds are applied (provided) on the supporting body made of paper, resin film or the like. The photochromic compounds includes a photochromic compound which develops cyan (C) color upon receiving an ultraviolet light and deletes the color upon receiving R (red) visible light, a photochromic compound which develops magenta (M) color upon receiving an ultraviolet light and deletes the color upon receiving G (green) visible light, and a photochromic compound which develops yellow (Y) color upon receiving an ultraviolet light and deletes the color upon receiving B (blue) visible light.

In the use of the medium, first, an ultraviolet light is irradiated to develop deep black color once, and the irradiation time periods and the intensities of the RGB lights are adjusted to control color optical densities of the three types of materials which develop YMC colors to display full colors. In this case, when high-intensity RGB lights are irradiated, the three types of YMC colors may be deleted to generate pure white color.

An apparatus capable of controlling light energy to use a medium having the reversible coloring/discoloring function as described above may also be achieved as the image forming apparatus having the light scanning device as described in the above embodiment.

Further, for example, the present invention may also be applied to an image forming apparatus using a silver-salt film as an image carrier. In this case, a latent image is formed on the silver-salt film by optical scanning, and the latent image may be visualized by a process similar to a developing process performed in a typical silver salt photographic process. Then, the image may be transferred to a printing paper by performing a process similar to the printing process in the typical silver salt photographic process. Such an image forming apparatus may include an optical photoengraving apparatus and an optical drawing apparatus capable of drawing a CT scan image and the like.

Further, as shown in FIG. 22 as an example, the image forming apparatus may be a color printer 2000 having plural photosensitive drums.

The color printer 2000 is a tandem-type multi-color printer forming a full-color image by combining four colors (black, cyan, magenta, and yellow). The color printer 2000 includes a station for black (K) (having a photosensitive drum K1, a charger K2, a developing device K4, a cleaning unit K5, and a transfer device K6), a station for cyan (C) (having a photosensitive drum C1, a charger C2, a developing device C4, a cleaning unit C5, and a transfer device C6), a station for magenta (M) (having a photosensitive drum M1, a charger M2, a developing device M4, a cleaning unit M5, and a transfer device M6), a station for yellow (Y) (having a photosensitive drum Y1, a charger Y2, a developing device Y4, a cleaning unit Y5, and a transfer device Y6), and an optical scanning device 2010, a transfer belt 2080, a fixing unit 2030 and the like.

The photosensitive drums rotate in the respective arrow directions shown in FIG. 22. In the vicinity of each photosensitive drum, along the rotating direction, the charger, the developing device, the transfer device, and the cleaning unit are disposed in this order. The chargers uniformly charge the surface of the respective photosensitive drums. The optical scanning device 2010 irradiates light onto the surfaces of the photosensitive drums to form latent images on the respective photosensitive drums, the surfaces having been charged by the respective chargers. Then, colored toner images are formed on the surfaces of the photosensitive drums by the respective developing devices. Further, the colored toner images are superposed onto the recording paper on the transfer belt 2080 by the respective transfer devices. Finally, the superposed colored image is fixed to the recording paper by the fixing unit 2030.

The optical scanning device 2010 includes light sources for the respective colors, the light sources including a surface emitting laser device similar to any one of the surface emitting laser device 100, the surface emitting laser device 100A, and the surface emitting laser device 100B or a surface emitting laser array similar to the surface emitting laser array 100M. Because of this feature, the optical scanning device 2010 may achieve the same effect as that achieved by the optical scanning device 1010. Further, the color printer 2000 includes the optical scanning device 2010; therefore, the color printer 2000 may achieve the same effect as that achieved by the laser printer 1000.

Further, in the color printer 2000, a color displacement may occur due to a manufacturing error, a positional error or the like of the parts used therein. Even in such a case, when the light sources of the optical scanning device 2010 have the surface emitting laser array similar to the surface emitting laser array 100M, the color displacement may be better controlled by appropriately selecting the emitting sections to be turned ON.

As described above, the surface emitting laser device and the surface emitting laser array according to embodiments of the present invention may be suitable for improving long-term reliability while suppressing the oscillation of high-order lateral modes. Further, the optical scanning device according to an embodiment of the present invention may be suitable for performing a stable optical scanning operation. Further the image forming apparatus according to an embodiment of the present invention may be suitable for forming a high-quality image.

According to an embodiment of the present invention, a surface emitting laser device includes an oscillator structure including an active layer; semiconductor multilayer reflection mirrors sandwiching the oscillator structure; an electrode provided on an emitting surface where a light is emitted, the electrode being provided in a manner such that the electrode surrounds an emitting region; and a dielectric film formed in at least one region outside a center part of the emitting region so that a refractive index of the region outside the center part of the emitting region is less than the refractive index of the center part of the emitting region. Further, when viewed from an emitting direction of the light, a part of the electrode overlaps a part of the dielectric film.

By having this structure, it may become possible to improve long-term reliability while suppressing high-order lateral mode oscillation.

According an embodiment of the present invention, a surface emitting laser array in which the surface emitting laser devices are integrated.

In this configuration, the surface emitting laser devices according to an embodiment of the present invention are integrated in the surface emitting laser array. Therefore, it may become possible to improve long-term reliability while suppressing high-order lateral mode oscillation.

According to an embodiment of the present invention, an optical scanning device capable of scanning a surface to be scanned with a light includes a light source having the surface emitting laser device, a deflector that deflects a light from the light source, and a scanning optical system that focuses the light deflected by the deflector onto the surface to be scanned.

In this configuration, the light source includes the surface emitting laser devices according to an embodiment of the present invention. Therefore, it may become possible to stably perform optical scanning.

According to an embodiment of the present invention, an optical scanning device capable of scanning a surface to be scanned with a light includes a light source having the surface emitting laser array, a deflector that deflects a light from the light source, and a scanning optical system that focuses the light deflected by the deflector onto the surface to be scanned.

In this configuration, the light source includes the surface emitting laser array according to an embodiment of the present invention. Therefore, it may become possible to stably perform optical scanning.

According to an embodiment of the present invention, an image forming apparatus includes an image carrier, and the optical scanning device that scans a light onto the image carrier, the light being modulated based on image information.

In this configuration, the optical scanning device according to an embodiment of the present invention is included. As a result, it may become possible to form a high-quality image.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface emitting laser device comprising:
an oscillator structure including an active layer;
semiconductor multilayer reflection mirrors sandwiching the oscillator structure;
an electrode provided on an emitting surface where a light is emitted, the electrode being provided in a manner such that the electrode surrounds an emitting region that includes a center part and another region outside the center part; and
a dielectric film formed in at least said another region of the emitting region so that a reflectance of said another region outside the center part of the emitting region is less than the reflectance of the center part of the emitting region, wherein
the dielectric film extends from said another region of the emitting region into an additional region external to the emitting region, and
when viewed from an emitting direction of the light, a part of the electrode overlying said additional region overlaps a part of the dielectric film.

2. The surface emitting laser device according to claim 1, wherein
the dielectric film has shape anisotropy between two directions orthogonal to each other.

3. The surface emitting laser device according to claim 2, wherein
the at least one region includes plural small regions, and
the plural small regions face each other across the center part of the emitting region.

4. The surface emitting laser device according to claim 3, wherein
the plural small regions facing each other across the center part of the emitting region include two regions formed by separating a circular ring-shaped region.

5. The surface emitting laser device according to claim 3, wherein
the oscillator structure and the semiconductor multilayer reflection mirrors are formed by crystal growth on an off-axis substrate,
the direction in which the small regions face each other across the center part of the emitting region is perpendicular to an off-axis direction of the off-axis substrate, and
the direction in which the small regions face each other across the center part of the emitting region is parallel to the polarization direction of the light.

6. The surface emitting laser device according to claim 1, wherein
an optical thickness of the dielectric film is an odd multiple of "(oscillation wavelength)/4".

7. The surface emitting laser device according to claim 1, wherein
the dielectric film is made of any one of SiNx, SiOx, TiOx, and SiON.

8. The surface emitting laser device according to claim 1, wherein
the region having relatively higher reflectance in the emitting region is covered with another dielectric film, and
an optical thickness of the other dielectric film is an even multiple of "(oscillation wavelength)/4".

9. The surface emitting laser device according to claim 8, wherein
when viewed from an emitting direction of the light, a part of the electrode overlaps a part of the other dielectric film covering the area having the relatively higher reflectance in the emitting region.

10. The surface emitting laser device according to claim 8, wherein
a material of the other dielectric film covering the area having the relatively higher reflectance in the emitting region is the same as a material of the dielectric film formed in the at least one region.

11. The surface emitting laser device according to claim 8, wherein the other dielectric film covering the area having the relatively higher in the emitting region includes plural laminated films having different refractive indexes.

12. The surface emitting laser device according to claim 11, wherein
an optical thickness of each of the plural laminated films is an odd multiple of "(oscillation wavelength)/4".

13. The surface emitting laser device according to claim 1, wherein
the emitting region is provided on an upper surface of a mesa structure,
an entire surface of the emitting region and an entire side surface of the mesa structure are covered with another dielectric film, and
the upper surface of the mesa structure is fully covered with at least one of the other dielectric film covering the entire surface of the emitting region and the electrode.

14. A surface emitting laser array comprising:
a plurality of surface emitting laser devices each of which being constituted according to claim 1.

15. An optical scanning device capable of scanning a surface to be scanned with a light, the optical scanning device comprising:
a light source having the surface emitting laser device according to claim 1;
a deflector that deflects a light from the light source; and
a scanning optical system that focuses the light deflected by the deflector onto a surface to be scanned.

16. An optical scanning device capable of scanning a surface to be scanned with a light, the optical scanning device comprising:
- a light source having the surface emitting laser array according to claim 14;
- a deflector that deflects a light from the light source; and
- a scanning optical system that focuses the light deflected by the deflector onto a surface to be scanned.

17. An image forming apparatus comprising:
- an image carrier; and
- the optical scanning device according to claim 15 that scans a light onto the image carrier, the light being modulated based on image information.

18. The image forming apparatus according to claim 17, wherein
the image information is multi-colored.

19. The surface emitting laser device according to claim 1, wherein the dielectric film formed in the at least one region outside the center part of the emitting region and is not formed in the center part of the emitting region, so that the reflectance of the at least one region outside the center part of the emitting region is less than the reflectance of the center part of the emitting region.

20. The surface emitting laser device according to claim 1, wherein the overlap between the part of the electrode and the part of the dielectric film reduces a likelihood of the dielectric film peeling off the device.

* * * * *